(12) United States Patent
Ware

(10) Patent No.: US 12,300,345 B2
(45) Date of Patent: *May 13, 2025

(54) AREA-EFFICIENT, WIDTH-ADJUSTABLE SIGNALING INTERFACE

(71) Applicant: Rambus Inc., San Jose, CA (US)

(72) Inventor: Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/581,694

(22) Filed: Feb. 20, 2024

(65) Prior Publication Data

US 2024/0265953 A1 Aug. 8, 2024

Related U.S. Application Data

(63) Continuation of application No. 18/097,459, filed on Jan. 16, 2023, now Pat. No. 11,955,198, which is a continuation of application No. 17/665,738, filed on Feb. 7, 2022, now Pat. No. 11,600,310, which is a continuation of application No. 16/148,984, filed on Oct. 1, 2018, now Pat. No. 11,302,367, which is a continuation of application No. 15/793,029, filed on Oct. 25, 2017, now Pat. No. 10,102,887, which is a continuation of application No. 13/315,149, filed on Dec. 8, 2011, now abandoned.

(60) Provisional application No. 61/438,861, filed on Feb. 2, 2011.

(51) Int. Cl.
*G11C 7/10* (2006.01)

(52) U.S. Cl.
CPC .......... *G11C 7/1012* (2013.01); *G11C 7/1045* (2013.01); *G11C 7/1087* (2013.01); *G11C 2207/105* (2013.01)

(58) Field of Classification Search
CPC ... G11C 7/1012; G11C 7/1087; G11C 7/1045; G11C 2207/105
See application file for complete search history.

(56) References Cited

U.S. PATENT DOCUMENTS

| | | | |
|---|---|---|---|
| 4,563,738 A | 1/1986 | Klan | |
| 6,525,565 B2 | 2/2003 | Young et al. | |
| 6,742,098 B1 * | 5/2004 | Halbert | G06F 13/4256 |
| | | | 711/172 |
| 6,894,531 B1 | 5/2005 | Nouban et al. | |
| 7,176,714 B1 | 2/2007 | Lee et al. | |
| 7,356,639 B2 | 4/2008 | Perego et al. | |
| 8,324,929 B1 | 12/2012 | Iyengar et al. | |
| 8,442,210 B2 | 5/2013 | Zerbe | |
| 2004/0019756 A1 | 1/2004 | Perego et al. | |
| 2004/0221106 A1 | 11/2004 | Perego et al. | |
| 2007/0070669 A1 * | 3/2007 | Tsern | G11C 5/02 |
| | | | 365/51 |

(Continued)

*Primary Examiner* — Mohammed A Bashar
(74) *Attorney, Agent, or Firm* — Charles Shemwell

(57) ABSTRACT

A lateral transfer path within an adjustable-width signaling interface of an integrated circuit component is formed by a chain of logic segments that may be intercoupled in different groups to effect the lateral data transfer required in different interface width configurations, avoiding the need for a dedicated transfer path per width configuration and thereby substantially reducing number of interconnects (and thus the area) required to implement the lateral transfer structure.

21 Claims, 18 Drawing Sheets

(56) References Cited

U.S. PATENT DOCUMENTS

2008/0080261 A1     4/2008   Shaeffer et al.
2017/0249265 A1     8/2017   Shaeffer et al.

\* cited by examiner

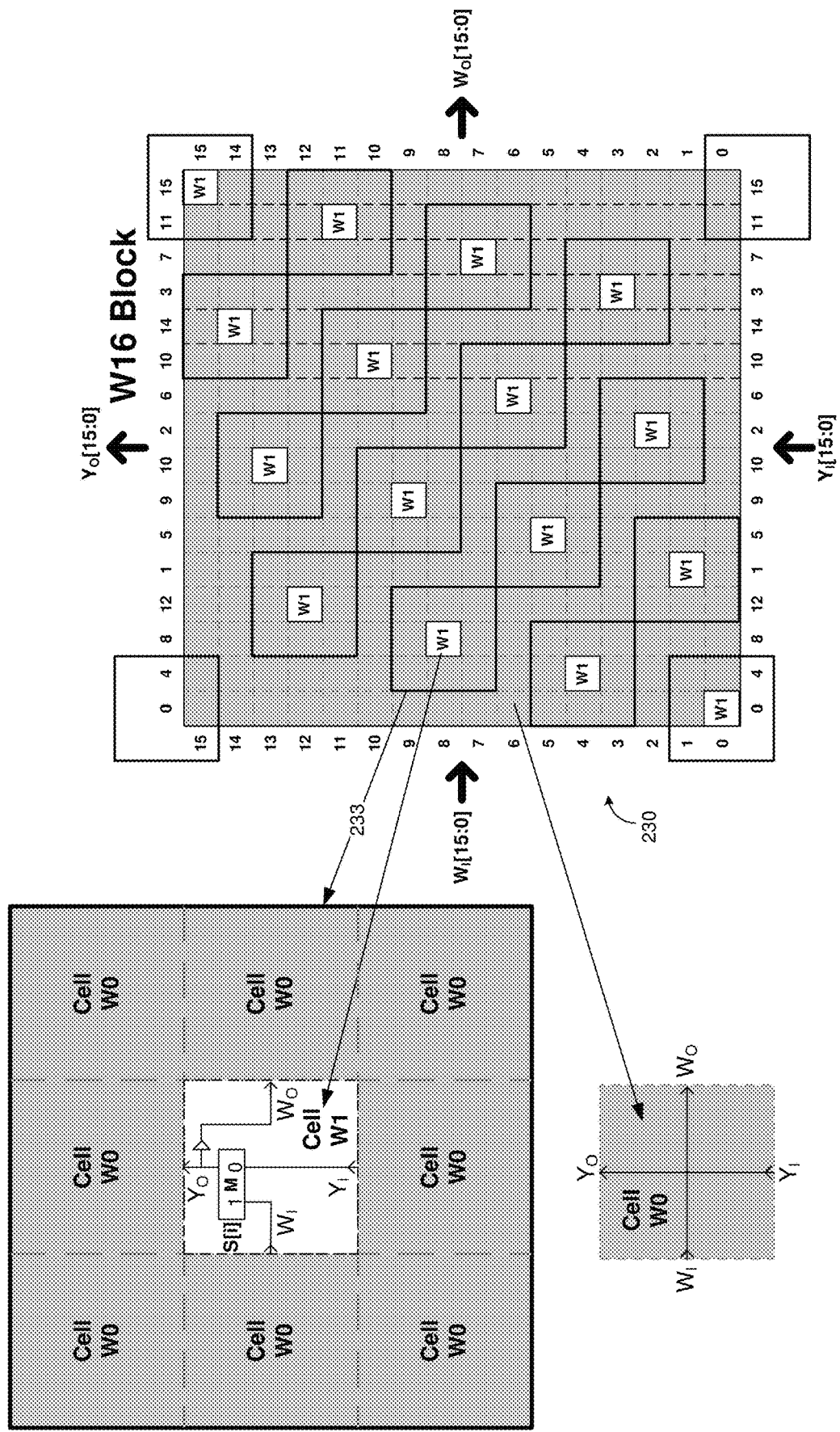

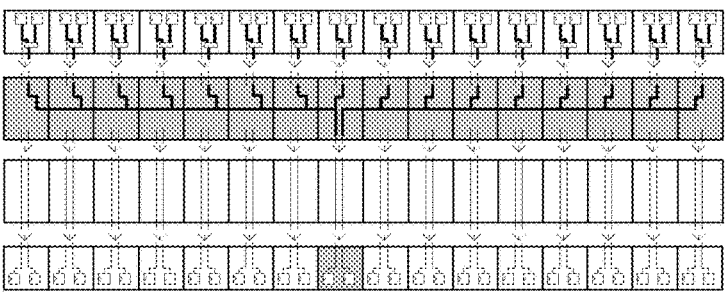
Fig. 13E x1 Interface
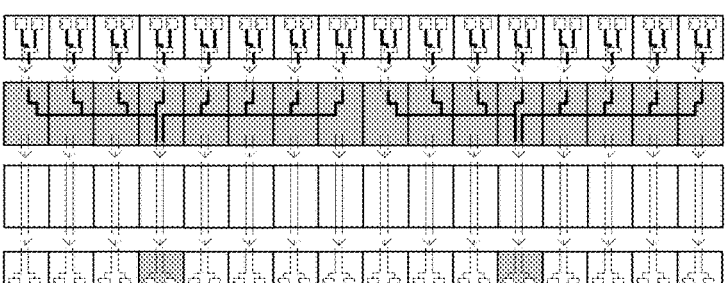
Fig. 13D x2 Interface
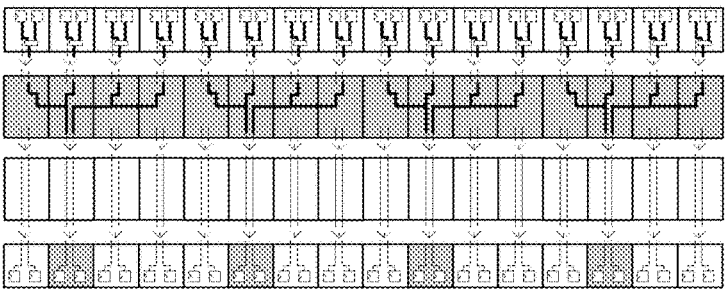
Fig. 13C x4 Interface
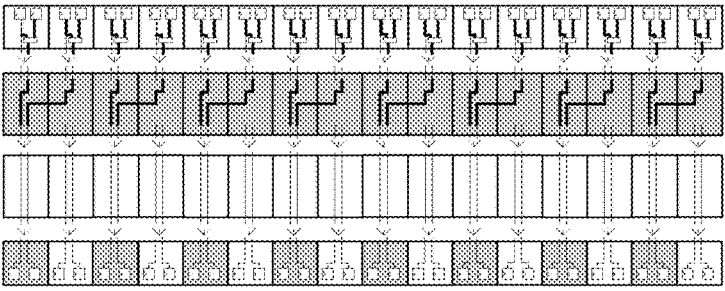
Fig. 13B x8 Interface
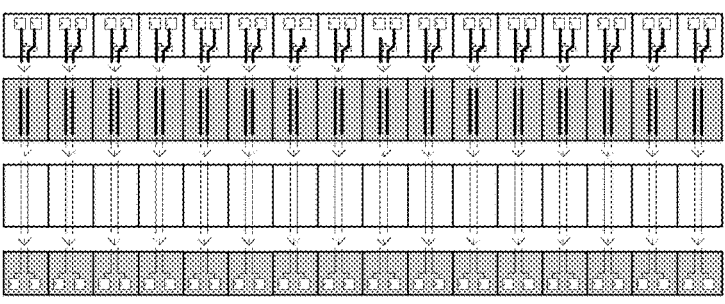
Fig. 13A x16 Interface

AREA-EFFICIENT, WIDTH-ADJUSTABLE SIGNALING INTERFACE

CROSS-REFERENCE TO RELATED APPLICATIONS

This application is a continuation of U.S. patent application Ser. No. 18/097,459 filed Jan. 16, 2023 (U.S. Pat. No. 11,955,198), which is a continuation of U.S. patent application Ser. No. 17/665,738 filed Feb. 7, 2022 (U.S. Pat. No. 11,600,310), which is a continuation of U.S. patent application Ser. No. 16/148,984 filed Oct. 1, 2018 (U.S. Pat. No. 11,302,367), which is a continuation of U.S. patent application Ser. No. 15/793,029 filed Oct. 25, 2017 (U.S. Pat. No. 10,102,887), which is a continuation of U.S. patent application Ser. No. 13/315,149 filed Dec. 8, 2011, which claims the benefit of U.S. Provisional Application No. 61/438,861 filed Feb. 2, 2011. Each of the above-identified patent applications is hereby incorporated by reference.

TECHNICAL FIELD

The present invention relates generally to the field of electronic communications and more particularly to signaling between integrated circuit devices.

BACKGROUND

In an integrated circuit (IC) device having an adjustable-width signaling interface, a selectable number of input/output (I/O) pins may be used to convey information-bearing signals, thus enabling an IC to be configured according to system requirements. In the context of a memory system, for example, a single memory IC having an adjustable width data interface that ranges from N I/O pins to N/M (N divided by M) I/O pins can be used to support the various pin widths demanded by different industry sectors, and can also be used to support capacity expansion techniques in which the number of signaling links allocated to a given memory IC is diluted (or reduced) as the memory IC population is increased.

Unfortunately, width adjustability has been limited to relatively low max/min width ratios (i.e., ratio of N to N/M, and thus low values of M) due to practical constraints involved with laterally transferring the data along the interface between internal registers and the I/O pins. More specifically, each halving of the interface width typically requires a lateral transfer bandwidth equal to the link bandwidth itself—a transfer bandwidth that begins to consume an impractically large volume of interconnect resources as the max/min width ratio grows larger than two. Moreover, signal propagation delay associated with the transfer tends to increase with the square of the physical transfer distance which itself is typically proportional to the max/min width ratio.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5 illustrates an alternative layout of transfer cells within a W16 transfer block that increases the die area available for transfer cell implementation;

FIGS. 13A-13E illustrate exemplary interface widths enabled by the split-route, bilateral transfer blocks of FIG. 12, and the state control signals applied to each of the transfer cells therein;

DETAILED DESCRIPTION

Integrated circuit devices having area-efficient, width-adjustable signaling interfaces formed by segmented lateral transfer paths are disclosed in various embodiments. In one embodiment, for example, a lateral-transfer path is formed by daisy-chained segments that include logic to select an input signal from either a downstream path segment or a local I/O node and transfer the selected input signal to both an upstream path segment and to a local destination register. By this arrangement, different subsets of the daisy-chained segments may be applied to effect lateral data transfer in different width configurations, avoiding the need for a dedicated transfer path per width configuration and thereby substantially reducing number of interconnects (and thus the area) required to implement the lateral transfer structure. In other embodiments, I/O nodes physically centered between data destinations (and sources) are selected to be the active I/O nodes in below-maximum width configurations thus halving (approximately) the lateral transfer distance and propagation time from I/O node to data destination. In yet other embodiments, the data incoming/outgoing via a given I/O node is split into upper and lower portions, with the upper data portion being laterally transferred to/from logic-side data registers above the I/O node and the lower data portion being laterally transferred to/from logic-side data registers below the I/O node. Because only half the total incoming data volume is laterally transferred in either direction, the net lateral transfer bandwidth (and thus the number of interconnects and area consumed thereby) is halved relative to the transfer bandwidth otherwise required. These and other embodiments are disclosed in further detail below.

Figure 1A:
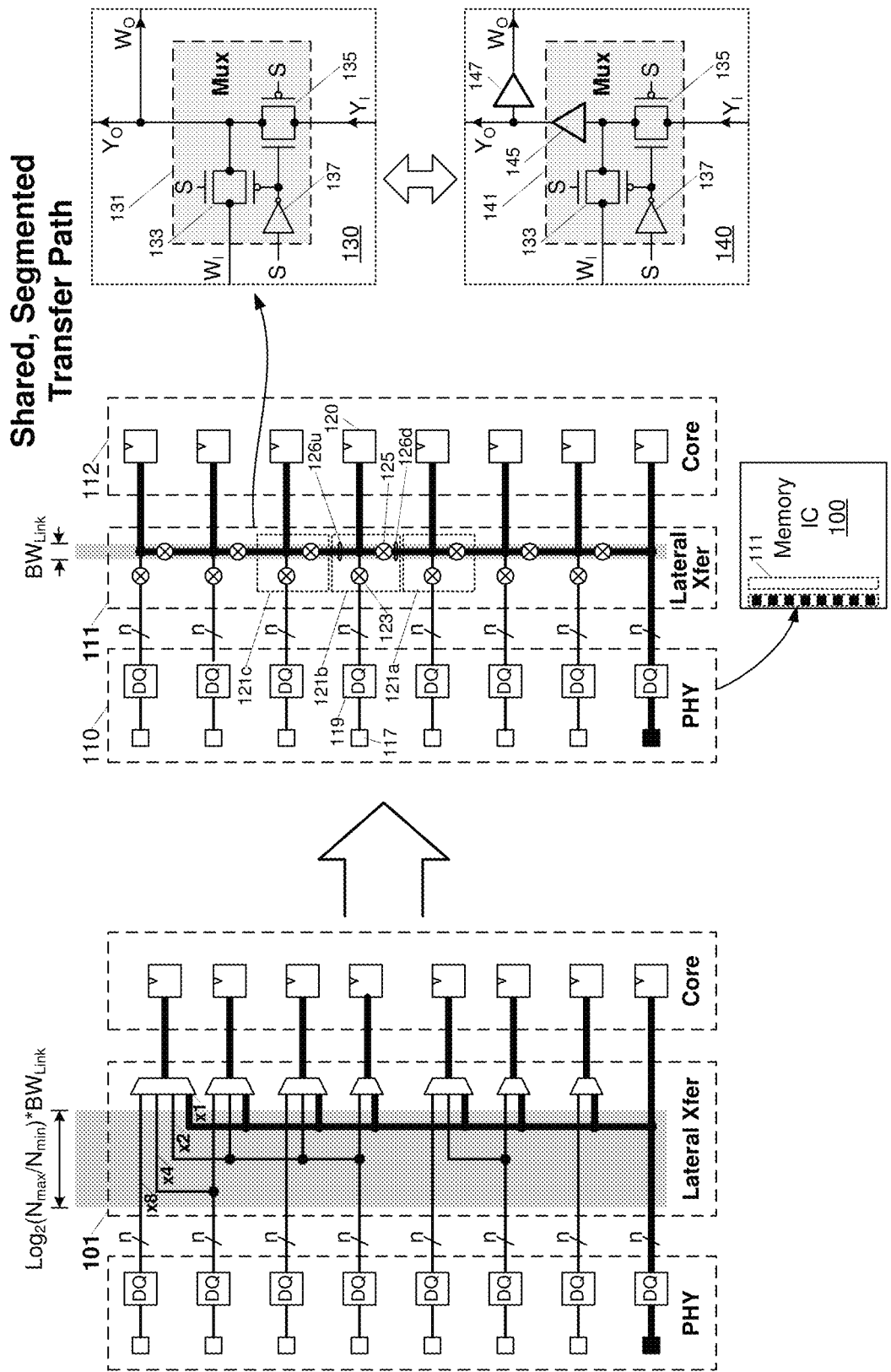
FIG. 1A contrasts the lateral-transfer bandwidth requirement of a lateral transfer structure formed by daisy-chained transfer segments according to one embodiment with the bandwidth required by multiplexing a set of discrete, continuous transfer paths.

FIG. 1A contrasts the lateral-transfer bandwidth requirement of a lateral transfer structure 111 formed by daisy-chained transfer segments according to one embodiment with the bandwidth required by multiplexing a set of discrete, continuous transfer paths (101).

In the continuous-path approach, shown at 101, the implementation area required by the conductors of the lateral-transfer structure (shaded) is dependent on the range of I/O widths supported by the signaling interface, $N_{max}$ to $N_{min}$. That is, each halving of the interface width (i.e., from $N_{max}$ to $N_{max}/2$, from $N_{max}/2$ to $N_{max}/4$, etc.) necessitates an additional lateral transfer path having bandwidth $BW_{Link}$ (i.e., as shown by paths marked "×4", "×2" and "×1"), and thus an additional number 'n' of lateral-transfer conductors corresponding to the serialization/deserialization ratio within the link transceivers (DQ) of the physical signaling interface (PHY). Assuming a serialization/deserialization ratio of 16, for example, the physical width of lateral transfer structure 101 grows by 16 conductors for each halving of the logical interface width (i.e., physical width of the lateral transfer structure is proportional to $Log_2(N_{max}/N_{min})*BW_{Link}$), a growth that rapidly exceeds the available implementation area and thus constrains the supportable logical interface widths to a relatively small range.

By contrast, the implementation area required by segmented lateral transfer structure 111 is independent of the range of supported interface widths and instead defined by the conductor count needed to support the bandwidth of a single link. In effect, by decomposing the lateral transfer structure into daisy-chained segments that can be switchably coupled to one another to form composite transfer paths of different lengths, and by limiting the PHY-side connection to a given composite transfer path to a solitary I/O node (i.e., the active I/O node used to source data to the core-side registers coupled to the composite transfer path), the full range of logical interface width selections, from the native or maximum width of the interface, Nmax, to a single I/O node (Nmin=1) may be achieved. Moreover, as discussed in further detail below, the individual segments may include buffer amplifiers that limit the $t_{RC}$ delay of laterally transferred signals, thus avoiding RC-dependent flight time delays that plague conventional implementations.

Still referring to FIG. 1A, which illustrates input data flow, segmented lateral transfer 111 is formed by a daisy chained set of lateral transfer segments (e.g., as shown at 121a, 121b, 121c), that enable formation of one or more lateral transfer paths between I/O nodes in PHY 110 and core registers within core 112. PHY 110 may form, for example, at least part of the physical signaling interface of memory IC 100, while core 112 represents the functional core of the IC (e.g., a memory array and circuitry to control access thereto in the case of memory IC 100) and is generally represented herein as a set of input or output registers for receiving data from or delivering data to PHY 110 via lateral transfer structure 111.

Each lateral transfer segment 121 (e.g., 121a, 121b, 121c) within segmented lateral transfer structure 111 is referred to herein as a "transfer cell" and is coupled to a local I/O node within PHY 110 (e.g., a pin or other link-interconnect 117 and data transceiver 119), and to a local core register 120, as well as to sets of one or more conductors 126u, 126d that form respective segments of a segmented lateral transfer path. Referring specifically to transfer cell 121b, a pair of switching elements 123, 125 are provided to switchably couple either the local I/O node or input transfer path segment 126d to output transfer path segment 126u and to local core register 120 (collectively, the "cell output"), thus enabling either the local I/O node or the downstream transfer cell to source data to the cell output. Moreover, input transfer path segment 126d constitutes the output transfer path segment of downstream transfer cell 121a, and output transfer path segment 126u constitutes the input transfer path segment to upstream cell 121c, thus establishing a daisy-chain (input-to-output-to-input-to-output, . . . ) of transfer path segments that can be driven by any of the data I/O nodes within the interface. More specifically, the "I/O" switching elements 123 within the chain of transfer cells may be configured to establish a single I/O node source (the active I/O node) within a cluster of I/O nodes, and the "transfer" switching elements 125 may be configured to establish one or more composite transfer paths, each switchably isolated (i.e., decoupled) from one another to conduct input data from the active I/O node to the subset of the core registers corresponding to the I/O node cluster.

Figure 1B:
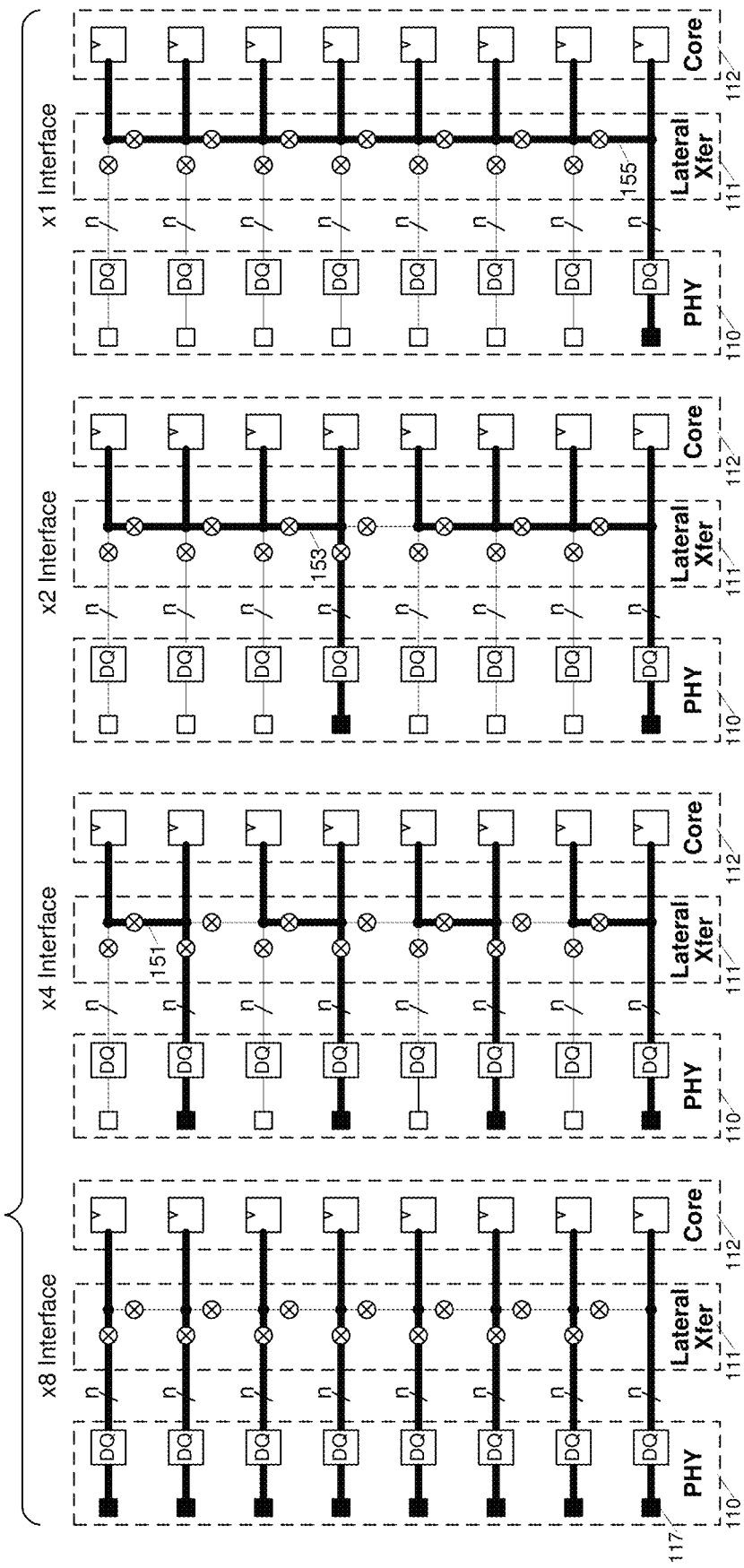
FIG. 1B illustrates different signal flow paths formed within the segmented lateral transfer structure of FIG. 1A for logical interface-width configurations ×8, ×4, ×2 and ×1.

FIG. 1B illustrates different signal flow paths formed within the segmented lateral transfer structure 111 of FIG. 1A for logical interface-width configurations ×8, ×4, ×2 and ×1 (i.e., 8 active I/O nodes, 4 active I/O nodes, 2 active I/O nodes and a single active I/O node). Active I/O nodes and inactive I/O nodes are distinguished by filled (solid black) and unfilled interconnects 117, respectively, and active and inactive signal paths (i.e., used and unused signal paths) are similarly shown by heavy (bold) and light (non-bold) line weights, conventions that are employed throughout the drawing figures. As shown, in a maximum or native-width interface configuration (i.e., ×8 in the particular example depicted), all transfer switching elements are opened and all I/O switching elements are closed to establish a respective direct path (i.e., no lateral transfer) from each I/O node to the corresponding core register (i.e., exclusively from local I/O node to local core register). By contrast, in the ×4 interface, each transfer cell in the chain is alternately configured to select the lateral-transfer input (transfer switching element closed, I/O switching element open) or the local I/O node as the input data source, thereby establishing four active I/O nodes each of which sources data to a cluster of two core interface registers through a respective one of four distinct composite transfer paths 151. In the ×2 configuration, the transfer cells are configured to establish two active I/O nodes, each of which sources data to a respective half of the core interface registers (clusters of four interface registers) via a composite transfer path 153 that extends from the transfer cell for the active I/O node through the transfer switching elements for three upstream transfer cells. In the ×1 configuration, the transfer cells are configured to establish a single active I/O node (i.e., all I/O switching elements opened) that sources data to the full set of core I/O registers via a composite transfer path 155 that extends through all the transfer cells (i.e., all transfer switching elements closed).

Comparing the different interface-width configurations shown in FIG. 1B, it can be seen that a composite transfer path applied in a given logical interface width is split into two distinct transfer paths when the interface width is doubled. Said another way, any two composite transfer paths applied in a given logical interface width are switchably coupled and thereby re-used to form a yet larger composite path when the interface width is halved. Thus, instead of requiring a new dedicated transfer path for each halving of the logical interface width, the daisy-chained segmented transfer path enables path segments to be re-used in each configuration, thereby avoiding the need for extra signal conductors to accommodate different logical interface widths (and the resulting range-dependent area consumption) that plagues conventional adjustable-width signaling interfaces.

Returning to FIG. 1A, because each transfer cell 121a, 121b, 121c selects either the local I/O node or the lateral-transfer input (i.e., from the downstream cell) to drive the cell output, the I/O and transfer switching elements are always in opposite states and thus constitute a two-state multiplexer (e.g., as shown at 131 within transfer cell embodiment 130). More generally, the transfer cell itself may be viewed as having one of two states: an I/O state to select the local I/O node as the input data source, or a transfer state that enables lateral (cell-to-cell) signal transfer. Thus, in the ×1 configuration shown in FIG. 1A (and at the far right in FIG. 1B), all transfer cells are in the transfer state (note that, though not shown or required, a transfer cell may also be provided in association with the bottom "always-active" I/O node, for example, to establish propagation time symmetry), while in the ×8 configuration shown in FIG. 1B, all transfer cells are in the I/O state. In each of the intermediate width configurations (i.e., less than the native or maximum width and greater than ×1 width), the transfer cells are mixed between transfer and I/O states, with the number of I/O-state transfer cells being equal to the logical interface width and the remaining transfer cells being in the transfer state to establish one or more composite transfer paths.

Different embodiments of two-state transfer cells that may be used to implement transfer cells 121 are shown at 130 and 140. In transfer cell 130, pass gates 133 and 135 (i.e., parallel N-type and P-type transistor elements coupled in parallel) are used to implement I/O and transfer switching elements 123 and 125, respectively. Complementary instances of select signal, 'S,' (generated in part by inverter 137) are supplied to control (gate) terminals of pass gates 133, 135 such that one of the pass gates is closed when the other is open and vice-versa, thus establishing a two-input multiplexer 131. In alternative embodiments, the I/O and transfer switching elements 123, 125 may be implemented by various circuit elements other than the pass-gates shown, including Boolean logic implementations in which the multiplexer select signal, S, I/O data input ($W_I$) and transfer data input ($Y_I$) are logically multiplexed to yield output signal $Y_O/W_O$.

While transfer cell 130 may suffice for relatively small interface widths, signal attenuation and $t_{RC}$ delay tend to increase rapidly as the cell count grows. To overcome these difficulties, transfer cell 140 includes, in addition to elements 133, 135, 137, a transfer buffer 145 (e.g., implemented by back-to-back inverter stages and optionally forming part of multiplexer 141) to drive the transfer output, $Y_O$, and an isolation buffer 147 to isolate the transfer output from the local output, $W_O$ (i.e., output coupled to the local core register), thereby providing a signal repeater at each transfer stage that may substantially lower the overall propagation time of a laterally transferred signal from the source I/O node to the most remote destination register. That is, in contrast to a continuous path approach in which the propagation delay grows in proportion to the square of the transfer path length (i.e., due to linearly increasing resistance and linearly increasing capacitance, and thus quadratically increasing $t_{RC}$), cell-by-cell buffering of transfer path segments limits the $t_{RC}$ delay along any given transfer path segment to yield a potentially lower net propagation delay along the segmented lateral transfer path than may be achieved using a continuous path approach.

Still referring to FIG. 1A, segmented lateral transfer structure 111 and segmented lateral transfer structures according to other embodiments discussed below may be deployed within the data interface of integrated-circuit memory device 100 (a "memory IC" such as a DRAM, SRAM, flash memory IC or any other IC having a mass storage array that consumes a substantial or predominant portion of the IC die area) to enable logical width adjustment ranging from the native or physical width of the data interface (Nmax) to a predetermined minimum logical width (Nmin). More generally, while many of the embodiments herein are discussed in the context of a memory IC and the flow of incoming write data and outgoing read data, the lateral transfer techniques and circuitry disclosed may in all cases be used to effect lateral transfer of other signal types within memory ICs, memory controllers or any other type of integrated circuit component. Also, while signaling interfaces are generally depicted as having native widths of ×8 or ×16 and minimum logical widths of ×1, wider or narrower native widths and/or larger minimum logical widths may apply. Similarly, while the interface widths shown in FIG. 1B and other embodiments are progressively halved to establish each narrower width configuration (i.e., $Nmax*2^{-i}$, where i ranges from 0 to $\log_2 Nmax$), the available width configurations are not limited to those depicted and may include intermediate widths that are not factor-of-two multiples (or fractions) of other logical widths.

Figure 2:
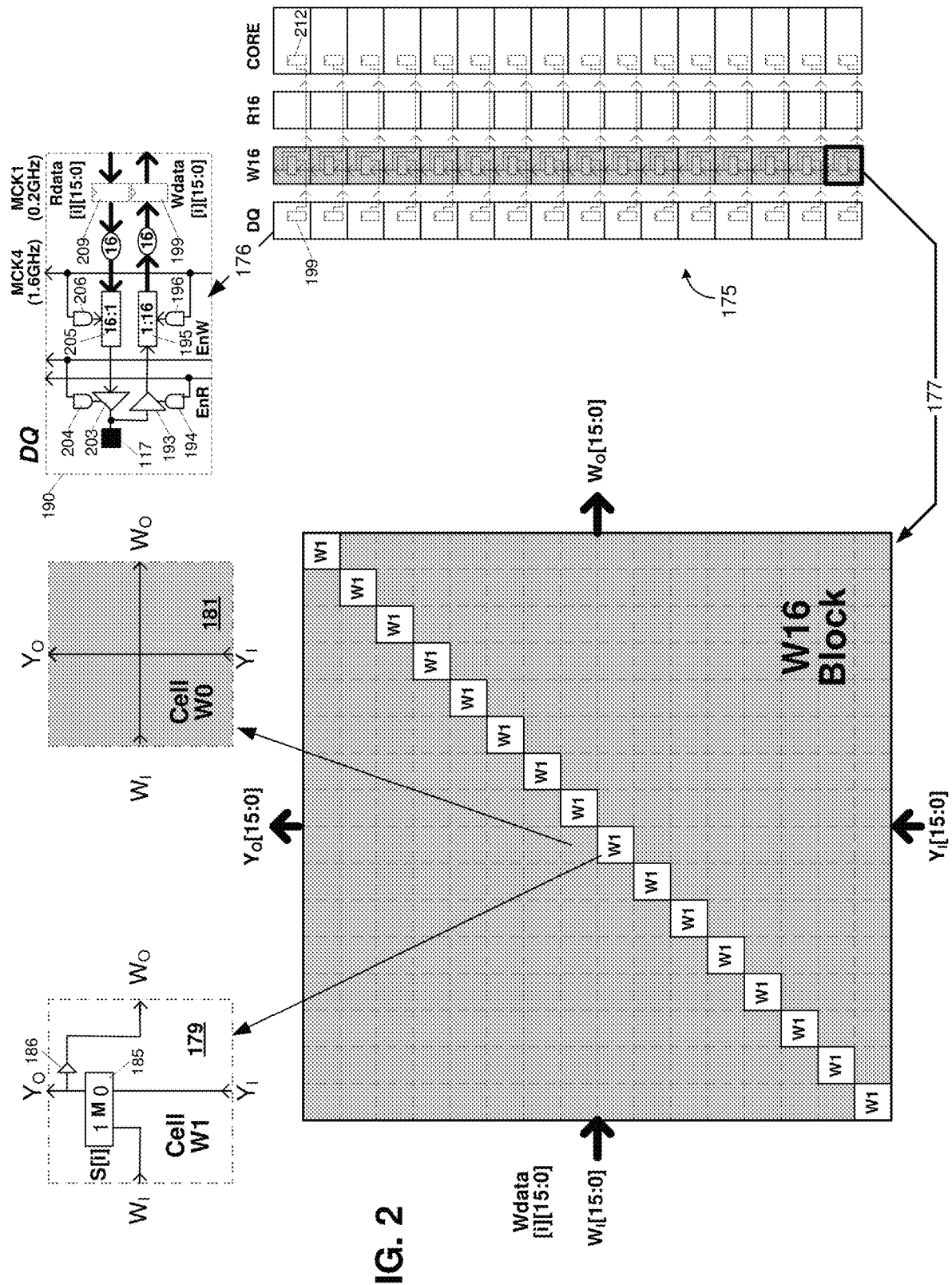
FIG. 2 illustrates a memory IC signaling interface having a ×16 native width in which each link transceiver performs a 1:16 write data deserialization, thus delivering up to 256 bits of write data to the memory core per memory access.

FIG. 2 illustrates an exemplary memory IC signaling interface 175 having a ×16 native width in which each link transceiver (DQ 190) performs a 1:16 write data deserialization, thus delivering up to 256 bits of write data to the memory core per memory access. As shown in detail view 176, each link transceiver 190 includes a signal receiver 193 and output driver 203 that are enabled during memory write and memory read operations, respectively (i.e., by enable logic gates 194, 204 that are controlled, at least in part, by enable-write (EnW) and enable-read (EnR) signals). The signal receiver 193 forwards a serialized write data signal (received via an external signaling link coupled to interconnect node 117) to 1:16 deserializing circuit 195. When enabled by logic 206, deserializing circuit 195 parallelizes successive bits of the incoming serial data signal in response to rising and falling edges of a data-rate clock signal, MCK4 (shown to be 1.6 GHz in this example and others below, though higher or lower frequency clock signals may be used in all cases), to yield a sequence of 16-bit write data values that are clocked into a 16-bit write data register in response to respective rising edges of a core clock signal, MCK1 (shown to be 0.2 GHz in this example and others below, though higher or lower frequency clock signals may be used), thereby forming respective write data words, Wdata[i][15:0], where 'i' is the link index. The read data output path within link transceiver 190 is essentially the reverse of the write data input path with each 16-bit read data word resulting from a memory read access (Rdata[i][15:0]) being clocked into read data register 209, serialized into a serial bit stream within serializer 205 and then driven onto signaling link 'i' (i.e., the external link coupled to interconnect 117) by output driver 203. Like the signal receiver and deserializer in the write data path, serializer 205 and output driver 203 may be selectively enabled (e.g., turned on only during read data transmission) by logic circuitry 206 and 204, respectively.

Focusing on the write data path, the sixteen write data values, Wdata[i][15:0] (where i ranges from 15 to 0 in the example shown), are delivered to respective write-data transfer blocks, "W16," that, together with counterpart read-data transfer blocks, "R16," constitute the lateral transfer circuitry within the signaling interface. In one embodiment, shown in detail view 177, each W16 block may be viewed as an array of interconnect cells, that include bit-transfer cells, W1 (179), and bit-routing cells, W0 (181). In the particular example shown, transfer cells 179 are disposed in a diagonal within the interconnect cell array (i.e., at array positions [i, i], where 'i' ranges from 0 to 15, and where array position [0,0] is situated at the bottom left corner of the array) so that the input and output signals for each transfer cell 179 may be conveyed exclusively through routing cells 181 as they extend to/from edges of the W16 block. As shown, each W1 cell includes a multiplexer 185 (which may internally include a buffer amplifier as shown at 141 in FIG. 1A) that selects between a local write-data input bit ($W_I$) and a lateral transfer input bit ($Y_I$) and drives the selected data bit (selected by a select signal, S[i], that is applied in common to all transfer cells 179 within block W16[i]) to the lateral transfer output ($Y_O$) and, via isolation buffer 186, to the local write-data output ($W_O$). As shown, the write-data outputs, $W_O$[15:0] are routed to respective destination data registers 212 within the core.

Figure 3:
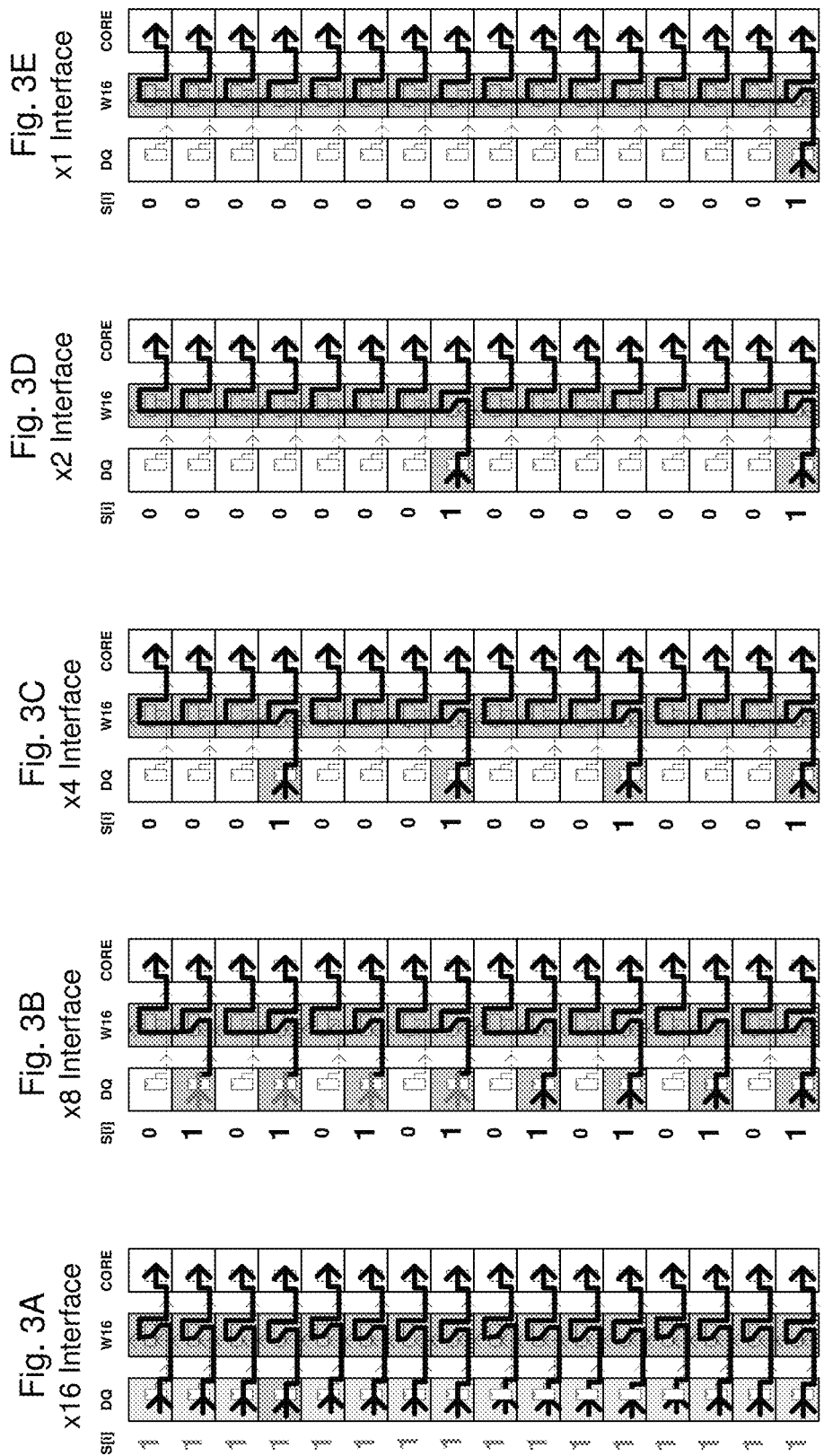
FIGS. 3A-3E illustrate different interface widths that may be enabled by respective combinations of composite paths within individual instances of the W16 transfer blocks shown in FIG. 2.

FIGS. 3A-3E illustrate different interface widths that may be enabled by respective combinations of composite paths within instances of the W16 transfer blocks shown in FIG. 2 (each of which may be viewed as a 16-bit wide instance of the write data transfer cell W1). As shown in FIG. 3A, when the individual select signals, S[i], of select value S[15:0] are all '1' (i.e., a logic high state, though the inverse logic state could alternatively be used), the 16-bit write data value from each local DQ is delivered directly via the corresponding (local) W16 block to the corresponding (local) core register, thus effecting a 16-bit wide interface in which 256 bits of data are delivered to the IC core at a peak rate corresponding to the MCK1 frequency. No lateral transfer is effected.

In the ×8 interface (FIG. 3B), every other select signal (i.e., the odd valued select signals, S[1], S[3], . . . , S[15] are set to a logic '0' state, thus rendering half the I/O nodes (DQ[1], DQ[3], . . . , DQ[15]) inactive and establishing eight composite lateral transfer paths to deliver write data to the core registers corresponding to the inactive I/O nodes.

In the ×4 interface of FIG. 3C, three out of every four select signals are set to a logic '0' (with only select signals S[j*4], where 'j'=0, 1, 2, 3, being raised). In the ×2 interface (FIG. 3D), only select signals S[j*8] (where 'j'=0,1) are raised, and in the ×1 interface (FIG. 3E), only select signal S[0] is raised.

Figure 4:
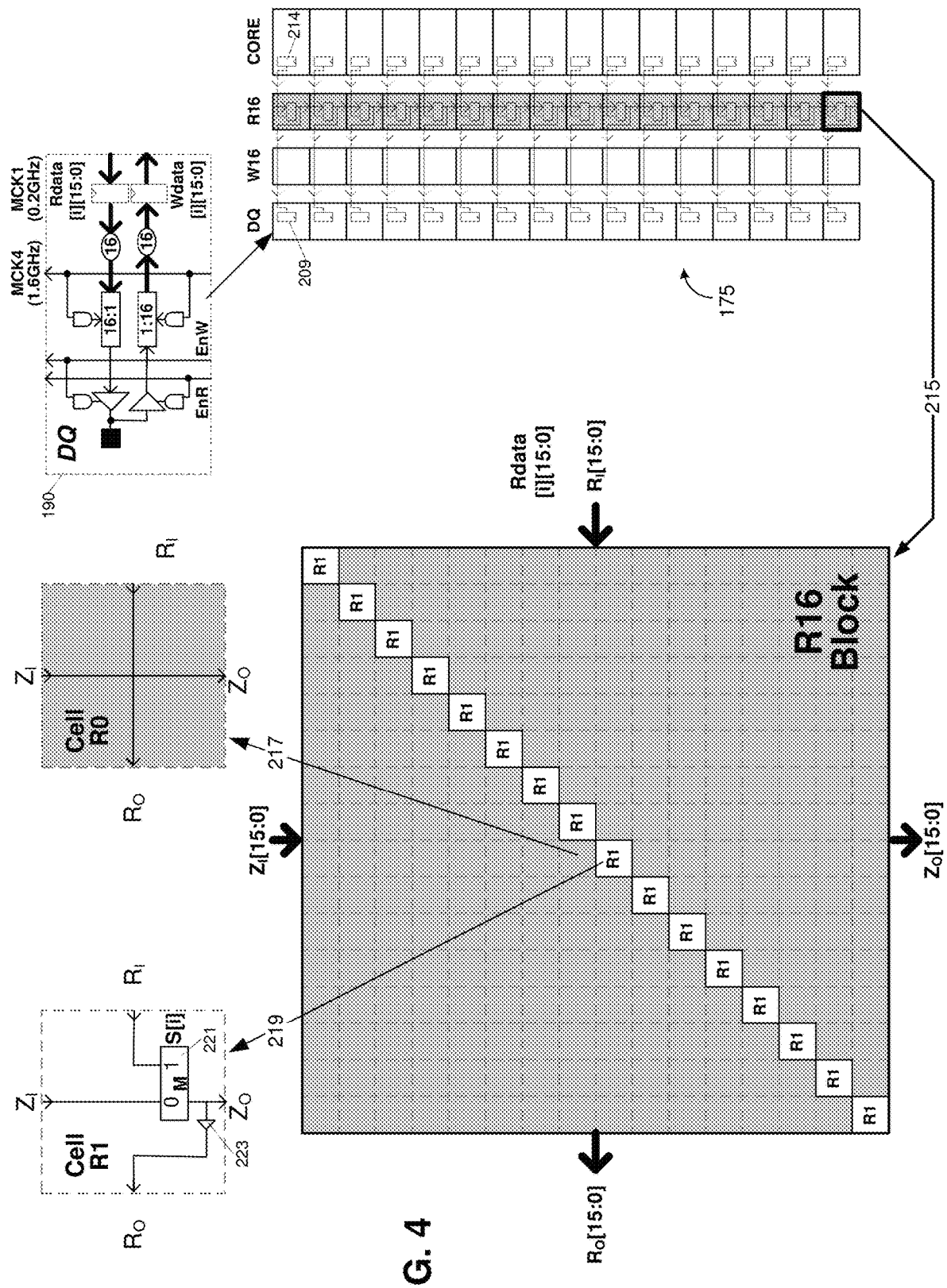
FIG. 4 illustrates the signaling interface of FIG. 2, showing detail within exemplary read-data transfer blocks that form part of the lateral-transfer circuitry.

FIG. 4 illustrates the signaling interface 175 shown in FIG. 2, showing detail within exemplary read-data transfer blocks ("R16" blocks) that form part of the lateral-transfer circuitry. In the embodiment shown in detail view 215, each R16 block is implemented in generally the same manner as the W16 block shown in FIG. 2, but re-oriented (i.e., flipped about the X axis and the Y axis) to establish memory core registers 214 as the data source and the DQ-side read data register 209 as the memory destination. Referring to detail views 217 and 219, for example, routing cell R0 is identical to routing cell W0 (with signal names changed to reflect direction and data source), and transfer cell R1 is implemented in essentially the same manner as cell W1 (having a multiplexer 221 and isolation buffer 223), except for reversal of inputs and outputs.

FIG. 5 illustrates an alternative layout of transfer (W1) cells within a W16 block 230 that increases the die area available for transfer cell implementation. That is, viewing the sixteen W1 cells as a 4×4 cell array that is to be distributed within the 16×16 W16 block in a manner maximizes (or at least increases) the distance between neighboring cells, then each W1 cell may be disposed four array positions (i.e., dimension of axis, 16, divided by number of W1 cells to be disposed along that axis, 4) from its neighbor in an adjacent row or column. The $Y_I/Y_O$ signal groups are remapped accordingly as shown by the signal group numbering along the upper and lower edges of W16 block 230. By this arrangement, the die area available for implementation of the multiplexing element and isolation amplifier is expanded by at least a factor of 9, for example, to the outer border of the peripheral routing cells shown in detail view 233 and marked by bold lines within W16 block 230. If the components of transfer cell W1 may be implemented in a non-square region, the outer boundary may potentially be expanded further in the X dimension and/or Y dimension, (e.g., extending into an area covered by up to 16 routing cells). Also, while a square aspect ratio (i.e., width/length ratio) is shown for W16 block 230 and individual cells therein, other aspect ratios may apply in alternative embodiments, including aspect ratios in which cell implementation area may be optimized by different layout patterns. Further, while shown in the context of a W16 block, the transfer cell layout of FIG. 5 may also be employed within the R16 block.

Reflecting on the different interface configurations shown in FIG. 1B (and FIGS. 3A-3E), it can be seen that the longest transfer path length, and thus the transfer path having the longest propagation time, occurs in the ×1 configuration, when signals are laterally transferred across the width of the physical interface, between a source I/O node at one end and a destination register at the opposite end. And while buffer amplifiers may be employed within individual transfer cells (e.g., as shown by transfer buffer 145 of FIG. 1A), timing skew or other synchronization problems resulting from the overall lateral transfer time may undesirably constrain the practicable lateral transfer distance and thus the maximum-to-minimum width ratio of the signaling interface.

Figure 6A:
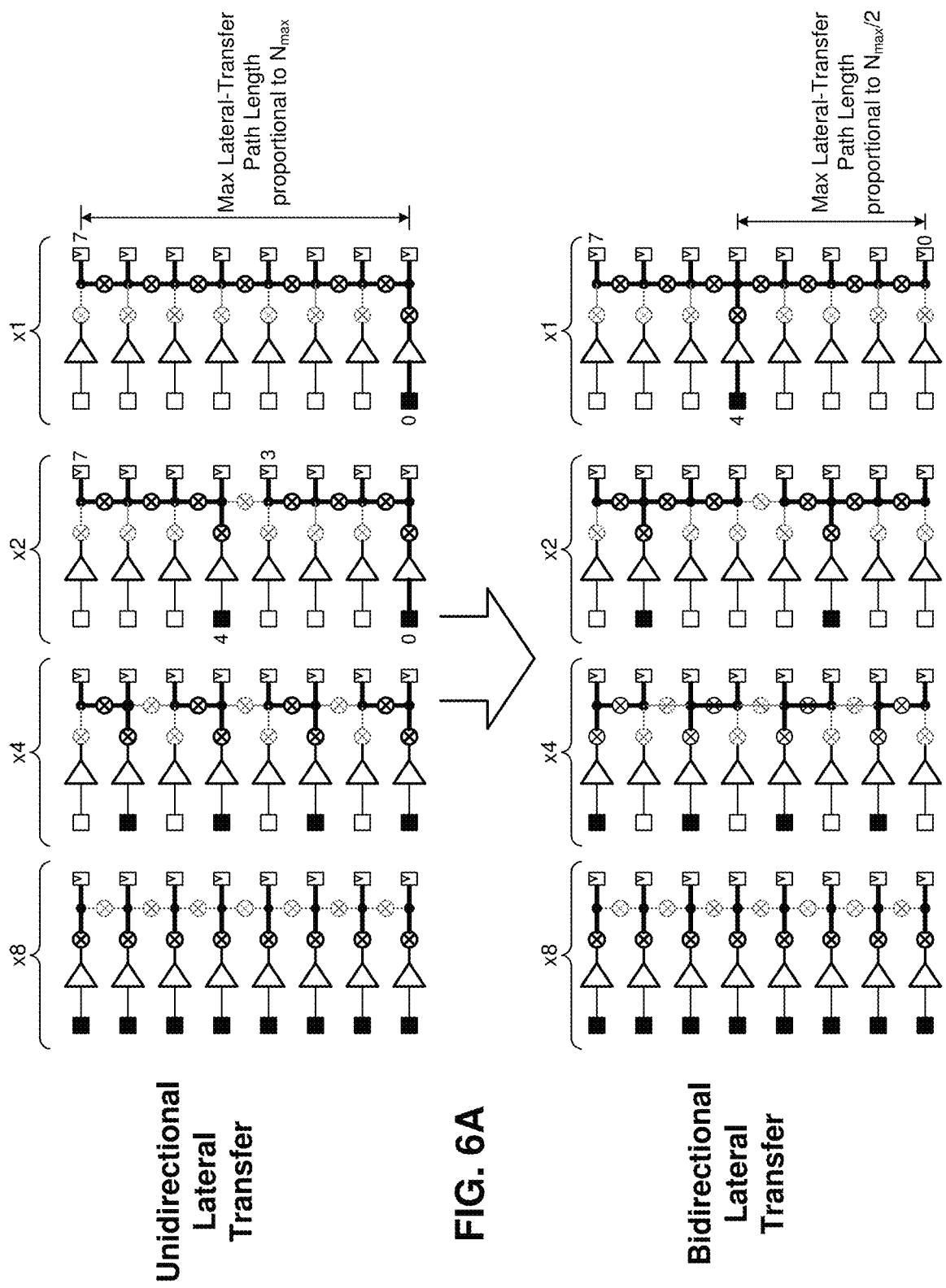
FIG. 6A illustrates an alternative lateral transfer structure that enables the lateral transfer distance within the worst-case transfer configuration to be cut approximately in half.

FIG. 6A illustrates an alternative lateral transfer structure, referred to herein as a "centered I/O" embodiment, that enables the lateral transfer distance within the worst-case transfer configuration (e.g., ×1) to be cut in half (or approximately so), thus substantially reducing the transfer propagation delay. In effect, by redesigning the transfer cells shown at 130 and 140 to enable bidirectional signal transfer in either direction along the segmented lateral transfer path, it becomes possible to establish an I/O node centrally disposed within a cluster of other unused I/O nodes as the source/destination I/O node (i.e., the active I/O node) for the corresponding cluster of core registers. FIG. 6A illustrates this effect, contrasting the unidirectional lateral transfer approach shown in FIGS. 1B and 3A-3E, with a bidirectional lateral transfer approach for each of four logical interface width configurations. As shown, for each single-source cluster of 'M' I/O nodes (i.e., group of I/O nodes having a single active I/O node and M−1 inactive I/O nodes), the active I/O node is selected to be I/O node M/2+1, where '/' denotes integer division and assuming that the I/O nodes are numbered sequentially from the bottom to the top of the cluster. Thus, in the ×8 configuration, where no single-source I/O cluster exists (i.e., all I/O nodes are active), data signals are routed identically in both the unidirectional and bidirectional transfer cases, as no lateral transfer occurs. By contrast, in the ×1 configuration, where the unilateral lateral transfer embodiment requires lateral transfer across the entire length of the physical interface, between the bottom-edge I/O node 0 and the top-edge core register 7, the centered I/O approach enables transfer from a centered I/O node 4 (i.e., 7/2+1) in both lateral directions (i.e., bilateral or bidirectional transfer) to the destination registers (0 and 7) at either end of the interface. As shown, this bidirectional lateral transfer from a centered I/O node cuts the maximum lateral transfer path approximately in half, relative to the unidirectional-transfer embodiment, thereby approximately halving the signal propagation time.

While the propagation time reduction is most notable in the narrowest width configuration (i.e., where the lateral transfer path or paths are longest), the transfer propagation time is also reduced in other logical width configurations. For example, in the ×2 width configuration, I/O nodes [2] and [6] are selected as the centered I/O's within respective single-source clusters of four I/O nodes, thus reducing the lateral transfer distance relative to the unidirectional lateral transfer arrangement. In the ×4 example, in which the single-source I/O cluster size is two, the lateral transfer distance is unidirectional regardless of the I/O node selected (i.e., there is only one lateral transfer destination) and in the native width, there is no lateral transfer at all.

Figure 6B:
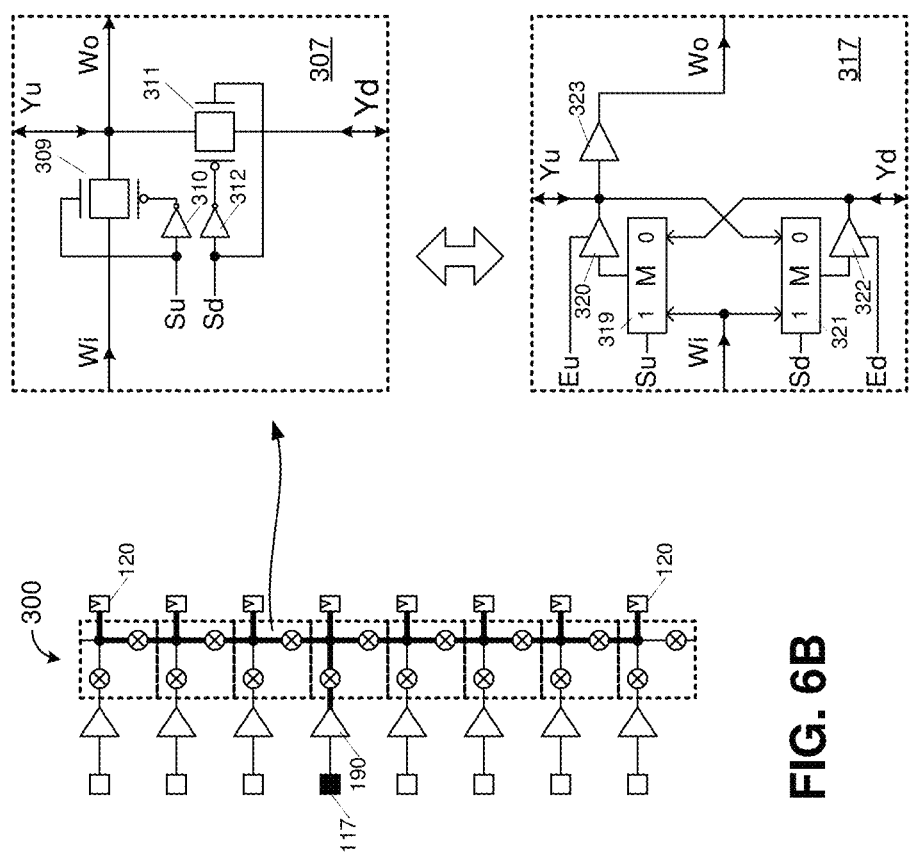
FIG. 6B illustrates embodiments of bidirectional transfer cells and that may be employed within a bidirectional lateral transfer structure to enable the interface width configurations shown in FIG. 6A.

FIG. 6B illustrates embodiments of bidirectional transfer cells 307 and 317 that may be employed within a bidirectional lateral transfer structure 300 to enable the interface width configurations shown in FIG. 6A. Bidirectional transfer cell 307 is implemented in generally the same manner as the unidirectional transfer cell (130) shown in FIG. 1A, except that independent select-up and select-down signals, Su and Sd, are supplied to the I/O and transfer switching elements 309 and 311 (and thus separate inverter elements 310, 312 are provided to generate complementary instances of the select signal). By this arrangement, both switching elements may be switched on concurrently (raising the select-up and select-down signals, Su and Sd) to enable an active, local I/O node (i.e., the center I/O node within a single-source cluster) to drive an input signal in both directions, up and down along the lateral transfer path and thus to core registers corresponding to inactive I/O nodes on either side of the active I/O node. As discussed, alternative structures may be used to implement the switching elements 309, 311 and buffer amplifiers may be provided to limit the $t_{RC}$ delay along wider interfaces.

The embodiment at 317 may be employed in applications where buffer amplifiers or other generally unidirectional circuit elements are desirable. As shown, the lateral transfer path is split into isolated upper and lower segments, Yu and Yd, each of which is either (i) undriven, (ii) driven according to the state of local input ($W_I$), or (iii) driven according to the state of a signal present on alternate transfer path segment (i.e., Yu driving Yd or vice-versa). More specifically, upper- and lower-segment drivers 320, 322 may be selectively enabled by enable signals Eu and Ed, respectively, to drive or refrain from driving a signal onto the upper and lower path segments, and upper- and lower-segment multiplexers 319 and 321 are controlled by respective select signals Su and Sd, to select either the local input, $W_I$, or the alternate transfer path segment as the signal source for an enabled segment driver (note that select signals Su and Sd will not necessarily have the same logic values within cell 317 as within cell 307 for a given width configuration). By this arrangement, bidirectional transfer cell 317 can be put into at least the following states, each of which is employed in one or more of the interface configurations shown in FIG. 6A:

Direct Output (Eu=1, Su=1, Ed=0, Sd=x, where 'x' indicates "don't care"): local input selected by upper segment multiplexer and driven onto upper path segment, while lower path segment is undriven;

Bidirectional Output (Eu=1, Su=1, Ed=1, Sd=1): local input selected by upper- and lower-segment multiplexers and driven onto both the upper and lower path segments;

Transfer-Up (Eu=1, Su=0, Ed=0, Sd=x, where 'x' indicates don't care): signal present on lower path segment driven onto upper path segment, thus effecting an upward lateral transfer;

Transfer-Down (Ed=1, Sd=0, Eu=0, Su=x): signal present on upper path segment driven onto lower path segment, thus effecting a downward lateral transfer; and Isolation: upper and lower transfer path segments undriven (Eu=0, Ed=0, Su=x, Sd=x).

Referring to the bilateral-transfer interface configurations shown in FIG. 6A, for example, in the ×8 configuration, each transfer cell is set to the direct output state to drive the upper transfer path segment according to the local input and to leave the lower transfer path segment undriven (thereby avoiding conflict with the transfer cell below).

In the ×4 configuration, each of the bidirectional transfer cells corresponding to an active I/O node is set to the bilateral output state to drive both upper and lower transfer path segments according to the state of the local input, thus delivering the input data to the local output ($W_O$) and to the local output of the immediately downstream transfer cell. By contrast, each of the bidirectional transfer cells corresponding to inactive I/O nodes (i.e., the cells immediately downstream from respective "active-node transfer cells") are set to the isolation state, thus avoiding contention with adjacent cells or, viewed, alternatively, isolating each dual-I/O cluster (i.e., single-source I/O cluster having one active I/O node and one inactive I/O node) from the others.

In the ×2 interface configuration, each of the bidirectional transfer cells corresponding to an active I/O node is again placed in a bidirectional output state, while, while the transfer cells immediately above and below a given bidirectional-output transfer cell are set to transfer-up and transfer-down states, respectively, and the bottom transfer cell in each quad-I/O cluster (i.e., cluster formed by I/O nodes 0-3 or cluster formed by I/O nodes 4-7) is set to an isolation state.

Similarly, in the ×1 interface configuration, the bidirectional transfer cell corresponding to the sole active I/O node (i.e., central I/O node 4 in this example, although node 3 may alternatively be used) is set to the bilateral output state, while all transfer cells above are set to the transfer-up state and all transfer cells below are set to the transfer-down state (except optionally the transfer cell corresponding to the bottom-edge I/O node, which may be set to the isolation state), thereby enabling data to be conveyed between the I/O node centered within the interface and the core registers above and below.

Figure 7:
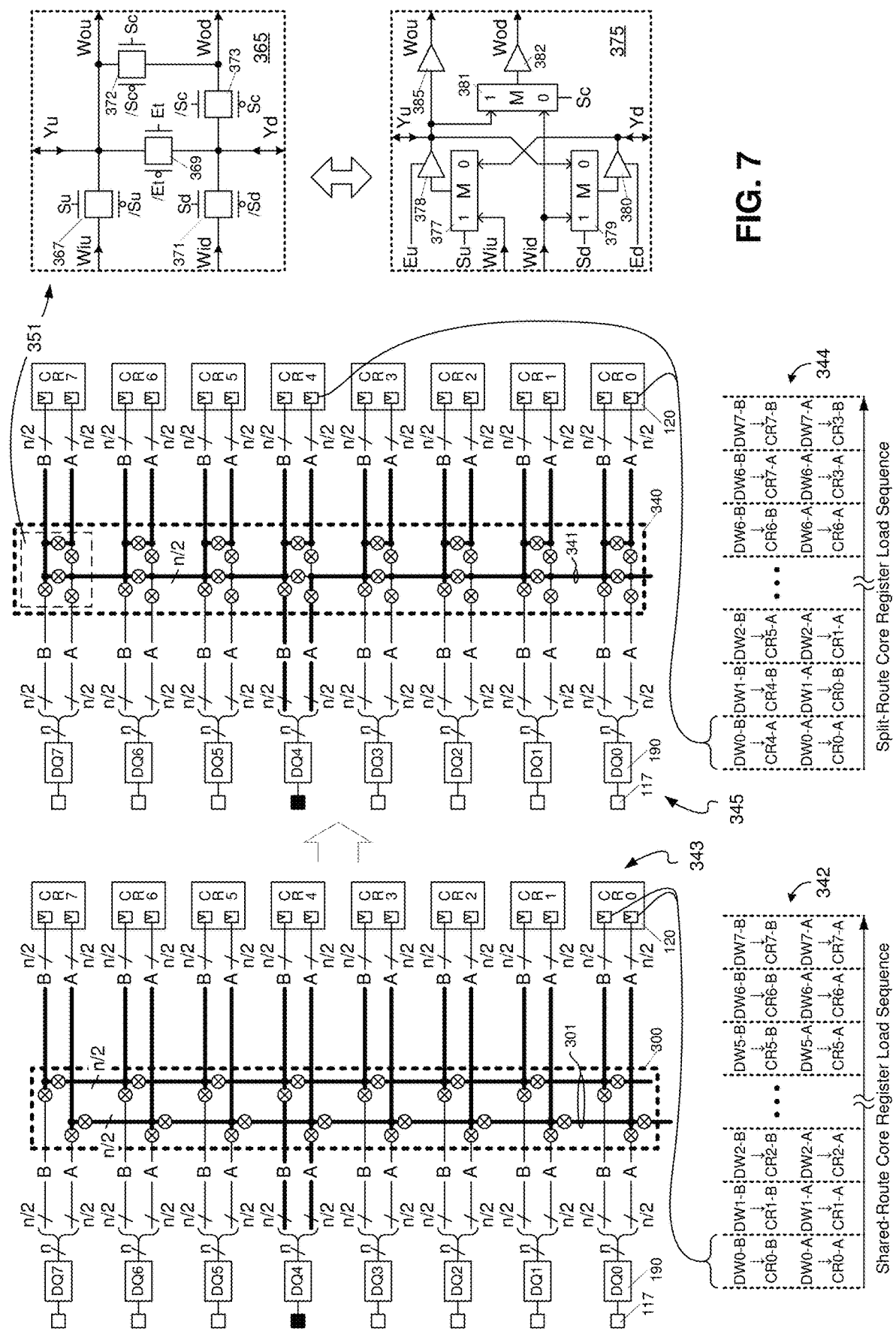
FIG. 7 illustrates a further reduction in lateral transfer bandwidth enabled by the centered I/O approach described in reference to FIGS. 6A and 6B.

FIG. 7 illustrates a further reduction in lateral transfer bandwidth enabled by the centered I/O approach described in reference to FIGS. 6A and 6B. More specifically, recognizing that data conveyed in a reduced-width interface configuration is loaded sequentially into respective core registers, it occurs that, instead of transferring an incoming data word upward or downward to a given core register during a register-load interval (i.e., following the load sequence shown at 342 carried out within interface 343), the incoming data may be split into upper and lower portions, with the upper portion being transferred upward and the lower portion being transferred downward during each data load interval. By partially remapping the data destination (or core register load sequence) in this way, only half of any incoming data word need be transferred in a given direction (up or down) by the lateral transfer structure, thus halving the required lateral transfer bandwidth (i.e., halving the number of signal conductors). For example, if the serialization/deserialization ratio ('n') effected within the data transceiver circuitry is 16, then the number of lateral transfer conductors required within the bidirectional, segmented lateral transfer structure may be reduced from 16 to 8. And while incoming write data is, in effect stored in different physical locations as a result of the remapped core register destinations, this change may be accommodated so long as all data read from the memory device follows the same mapping as data written to the memory device. That is, the association (mapping) between memory address and physical location of the accessed storage cells may be changed without adverse consequence so long as read and write operations directed to the same memory address access the same data. Thus, by remapping the data destinations within the core load sequence, the shared-route load sequence 342 in which n/2-bit wide portions ('A' and 'B' in FIG. 7) of an incoming data word are routed side-by-side along an n-conductor lateral transfer path 301 may be replaced by the split-route load sequence 344 within interface 345 in which n/2-bit wide portions of each incoming data word are routed in opposite directions, up and down, along respective n/2-conductor segments of lateral transfer path 341, thus halving the width of the lateral transfer structure with negligible overhead.

Still referring to FIG. 7, transfer cell embodiments that may be used to support the split-route load sequence are illustrated at 365 and 375. In transfer cell 365, a pair of I/O switching elements 367 and 371 are supplied to enable respective "up" and "down" portions of an input data word, Wiu and Wid, to be coupled to respective up and down segments (Yu and Yd, also referred to herein as upper and lower segments, respectively) of a lateral transfer path. A through-cell switching element 369 is also provided to enable the upper and lower transfer path segments to be coupled to one another, and a multiplexer, formed by switching elements 372 and 373 is provided to select the signal present on either the upper or lower path segment to drive the lower portion of the local data output, Wod. The upper portion of the local data output, Wou, is coupled to upper transfer path segment, Yu, and is thus driven by the signal delivered to the upper path segments via switching elements 367, 371 and/or 369 or by counterpart switching elements in the transfer cell above. Select signals, Su and Sd (select-up and select-down) are supplied to control inputs (e.g., gates) of I/O switching elements 367 and 371, and thus control coupling of the upper and lower local data inputs (Wiu, Wid) to the upper and lower transfer path segments, respectively. Enable signal Et (enable-through) is applied to control input(s) of switching element 369 to enable the upper and lower path segments to be switchably coupled to or decoupled from one another, and select signal, Sc (select-common), is used to control the operation of the output multiplexer (i.e., multiplexer formed by switching elements 372 and 373), enabling the signal present on the lower path segment to drive the lower data output (Wod), or enabling the signal present on the upper path segment to drive the upper and lower data outputs (Wou, Wod) in common.

Transfer cell 375 enables the same functional path connections as transfer cell 365, but includes buffer amplifiers 382, 385 and other generally unidirectional circuit elements to mitigate, for example, transfer-distance-dependent $t_{RC}$. For example, upper and lower segment multiplexers 377, 379 and upper and lower segment drivers 378 and 380 (e.g., tri-state drivers) enable the data-source select operations and switched through-connection provided by switching elements 367, 369 and 371 within transfer cell 365, and output multiplexer 381 corresponds to switching elements 372 and 373. Further, the segment multiplexers 377, 379 and segment drivers 378, 380 correspond to the segment multiplexers 319, 321 and segment drivers 320, 322 shown in transfer cell 317 of FIG. 6B, except that the input data source is split into upper and lower portions (Wiu and Wid), and the upper and lower transfer path segments (Yu and Yd) are half as wide as their counterparts in transfer cell 317 as only half as much data is transferred in a given direction through transfer cell 375.

Each of the transfer cell embodiments 365, 375 shown in FIG. 7 may be set to the following states to support different logical interface width configurations (note that, though its logic state is not specifically shown below, enable-through signal, Et, my be expressed as (Ed*/Sd)+(Eu*/Su), where '*' denotes logical AND, '+' denotes logical OR, and '/' denotes logical NOT):

Direct Output (Eu=1, Su=1, Ed=0, Sd=x, Sc=0): upper portion of local input selected by upper segment multiplexer and driven onto upper transfer path segment (and thus to upper local core register), lower portion of local input forwarded to lower core register via output multiplexer, and lower transfer path segment undriven;

Bidirectional Output (Eu=1, Su=1, Ed=1, Sd=1, Sc=1): upper and lower portions of local input selected by upper- and lower-segment multiplexers and driven onto both the upper and lower path segments, respectively;

Transfer-Up (Eu=1, Su=0, Ed=0, Sd=x, Sc=1): signal present on lower path segment driven onto upper path segment, thus effecting an upward lateral transfer;

Transfer-Down (Ed=1, Sd=0, Eu=0, Su=x, Sc=1): signal present on upper path segment driven onto lower path segment, thus effecting a downward lateral transfer; and Isolation: upper and lower transfer path segments undriven, and upper path segment coupled in common to upper and lower data outputs (Eu=0, Ed=0, Su=x, Sd=x, Sc=1).

Figure 8:
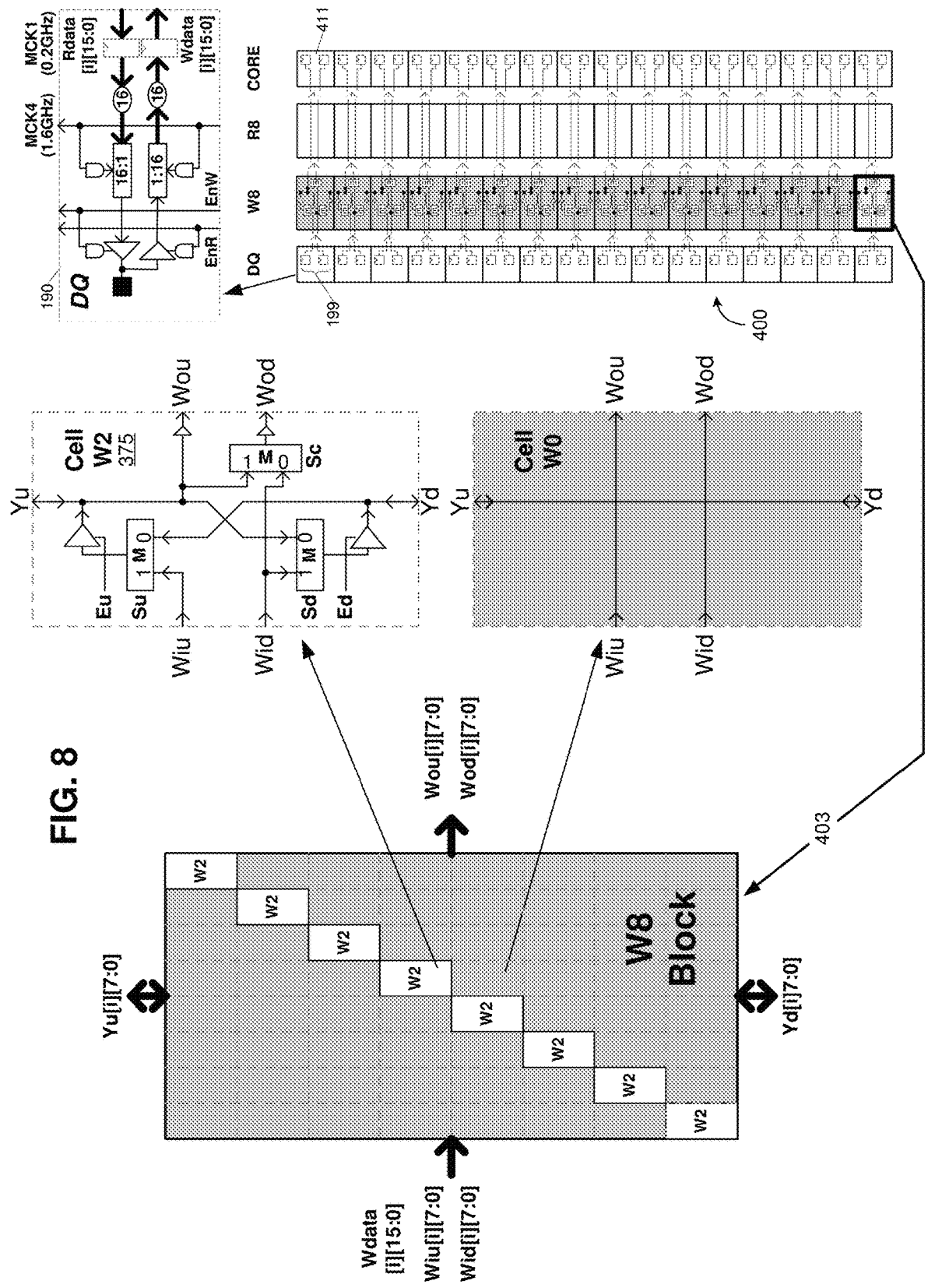
FIG. 8 illustrates an embodiment of a ×16 signaling interface modified relative to signaling interface of FIG. 2 to include split-route, bidirectional transfer cells corresponding to transfer cell 375 of FIG. 7.

FIG. 8 illustrates an embodiment of a ×16 signaling interface 400 modified relative to signaling interface 175 of FIG. 2 to include split-route, bidirectional transfer cells W2 (i.e., transfer cells corresponding to transfer cell 375 of FIG. 7). As shown at 403, a set of eight W2 transfer cells, each receiving upper and lower write data input bits (Wiu, Wid) are applied in place of the 16, single-input-bit W1 cells shown in FIG. 2. A single lateral transfer conductor formed by upper and lower segments, Yu and Yd, is coupled to each W2 transfer cell, so that the constituent number of conductors (and thus the physical width) within the segmented lateral transfer path is reduced from 16 (in FIG. 2) to 8, and thus the block of eight W2 cells is referred to as a "W8 block." Schematically, each W8 block may be viewed as an instance of the W2 cell in which each input (Wiu or Wid), output (Wou or Wod) and transfer path segment (Yu or Yd) is eight bits wide. The routing cell, W0, I/O nodes ("DQ") and core may be implemented generally as described in reference to FIG. 2, though the DQ and core registers shown at 199 and 411, respectively, are each depicted as having two constituent registers and corresponding pairs of output paths and input paths to emphasize that two portions of data are being separately routed within the set of sixteen W8 blocks that form the segmented lateral transfer circuitry.

FIGS. 9A-9E illustrate exemplary interface widths enabled by the split-route, bilateral transfer blocks W8 of FIG. 8, and the transfer-state control signals (Eu, Su, Ed, Sd, Sc, as shown at 415) applied to each of the W2 transfer cells 375 therein. For example, in the ×16 configuration, each W8 transfer cell block (numbered 0-15 from bottom to top) is set to the direct output state to drive the upper portion of the input data to the upper local core register via the upper transfer path segment, and to drive the lower portion of the input data to the lower local core register via the output select multiplexer (i.e., element 381 of FIG. 7). In this configuration, no lateral transfer is effected in either direction, and instead the local write data is supplied to the local core registers for each W8 transfer block.

In the ×8 configuration, each W8 transfer block corresponding to an active I/O node is set to the bilateral output state to drive both upper and lower transfer path segments according to the state of the local input, thus delivering the upper portion of the local input data in common to the upper and lower local core registers, and laterally transferring the lower portion of the local input data to the downstream (i.e., lower and adjacent) W8 block for delivery to the upper and lower core registers for that transfer block. By contrast, each of the W8 transfer blocks corresponding to inactive I/O nodes (i.e., the W8 blocks immediately downstream from respective "active-node transfer blocks") are set to the isolation state, thus avoiding contention with adjacent W8 blocks or, viewed, alternatively, isolating each of eight dual-I/O clusters (i.e., single-source I/O cluster having one active I/O node and one inactive I/O node) from the others.

In the ×4 interface configuration, each of the W8 transfer blocks corresponding to an active I/O node is again placed in a bidirectional output state, while the W8 transfer blocks immediately above and below are set to transfer-up and transfer-down states, respectively, and the bottom W8 transfer block in each quad-I/O cluster (i.e., cluster formed by I/O nodes 0-3, 4-7, 8-11, or 12-15) is set to an isolation state.

Similarly, in the ×2 interface configuration, each of the W8 transfer blocks corresponding to an active I/O node is placed in a bidirectional output state, while the three W8 transfer blocks immediately above and below are set to transfer-up and transfer-down states, respectively, and the bottom W8 transfer block in each eight-I/O cluster (i.e., cluster formed by I/O nodes 0-7 or 8-15) is set to an isolation state.

Lastly, in the ×1 interface configuration, the W8 transfer block corresponding to the sole active I/O node (i.e., central I/O node 8 in this example, although node 7 may alternatively be used) is set to the bilateral output state, while all transfer cells above are set to the transfer-up state and all transfer cells below are set to the transfer-down state (except optionally the transfer cell corresponding to the bottom-edge I/O node, which may be set to an isolation state), thereby enabling respective upper and lower portions of the input data to be conveyed between the I/O node centered within the interface and the core registers above and below.

Figure 9:
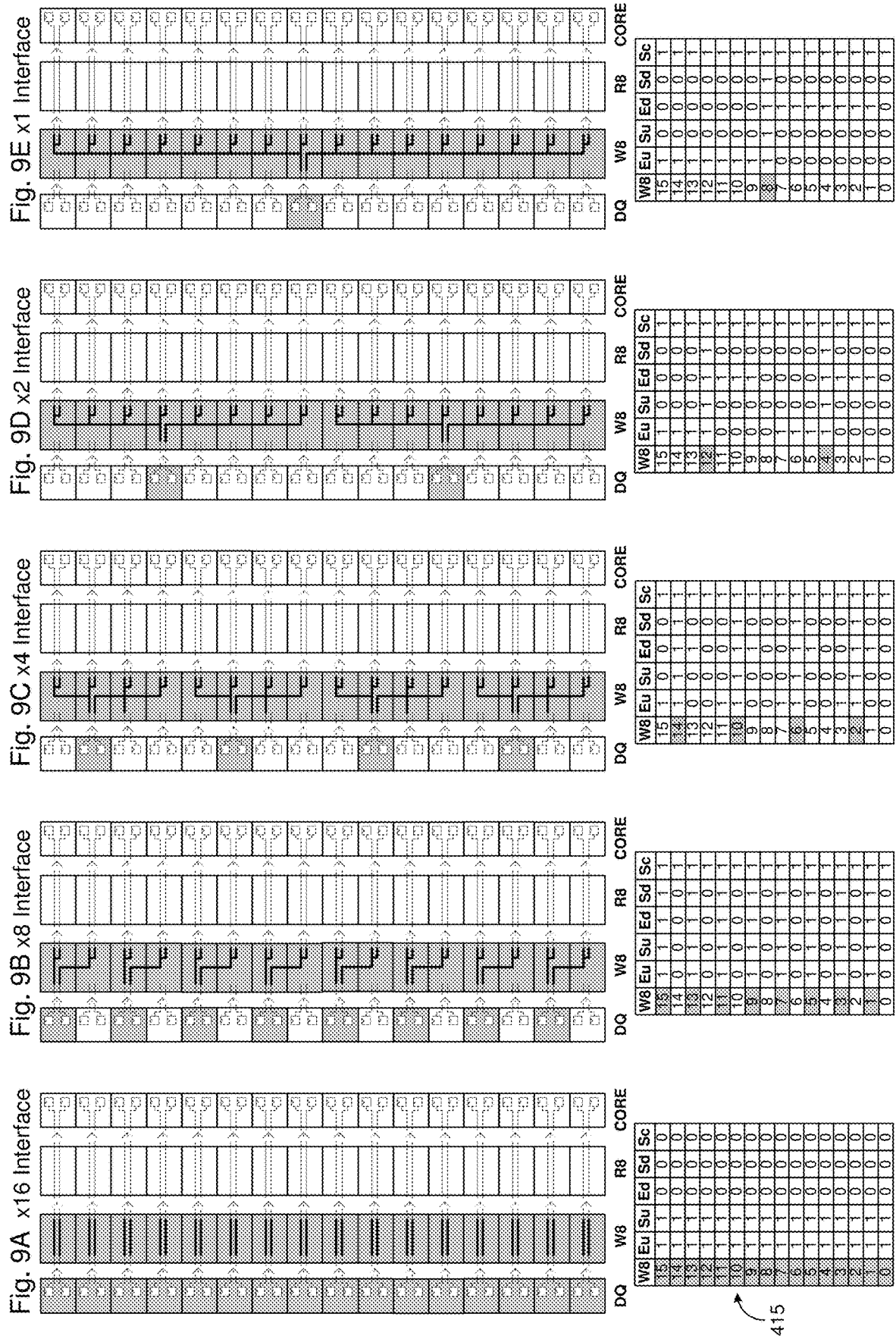
FIGS. 9A-9E illustrate exemplary interface widths enabled by the split-route, bilateral transfer blocks of FIG. 8, and the transfer-state control signals applied to the transfer cells therein.
Figure 10:
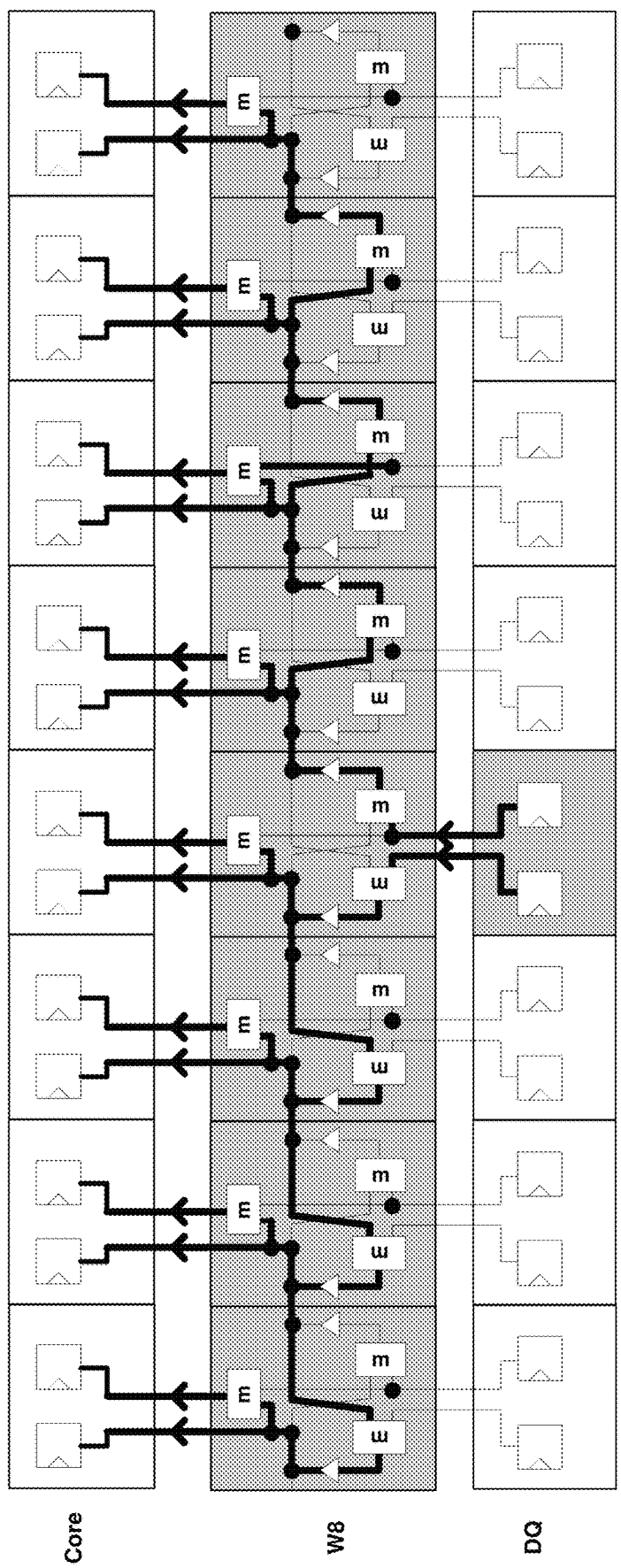
FIG. 10 illustrates an expanded view of an 8-I/O single-source cluster within the ×2 configuration shown in FIG. 9D.

FIG. 10 illustrates an expanded view of an 8-I/O single-source cluster within the ×2 configuration shown in FIG. 9D to provide an appreciation of the upward and downward transfer routing enabled by the split-route, bidirectional transfer cells within each W8 transfer block.

Figure 11:
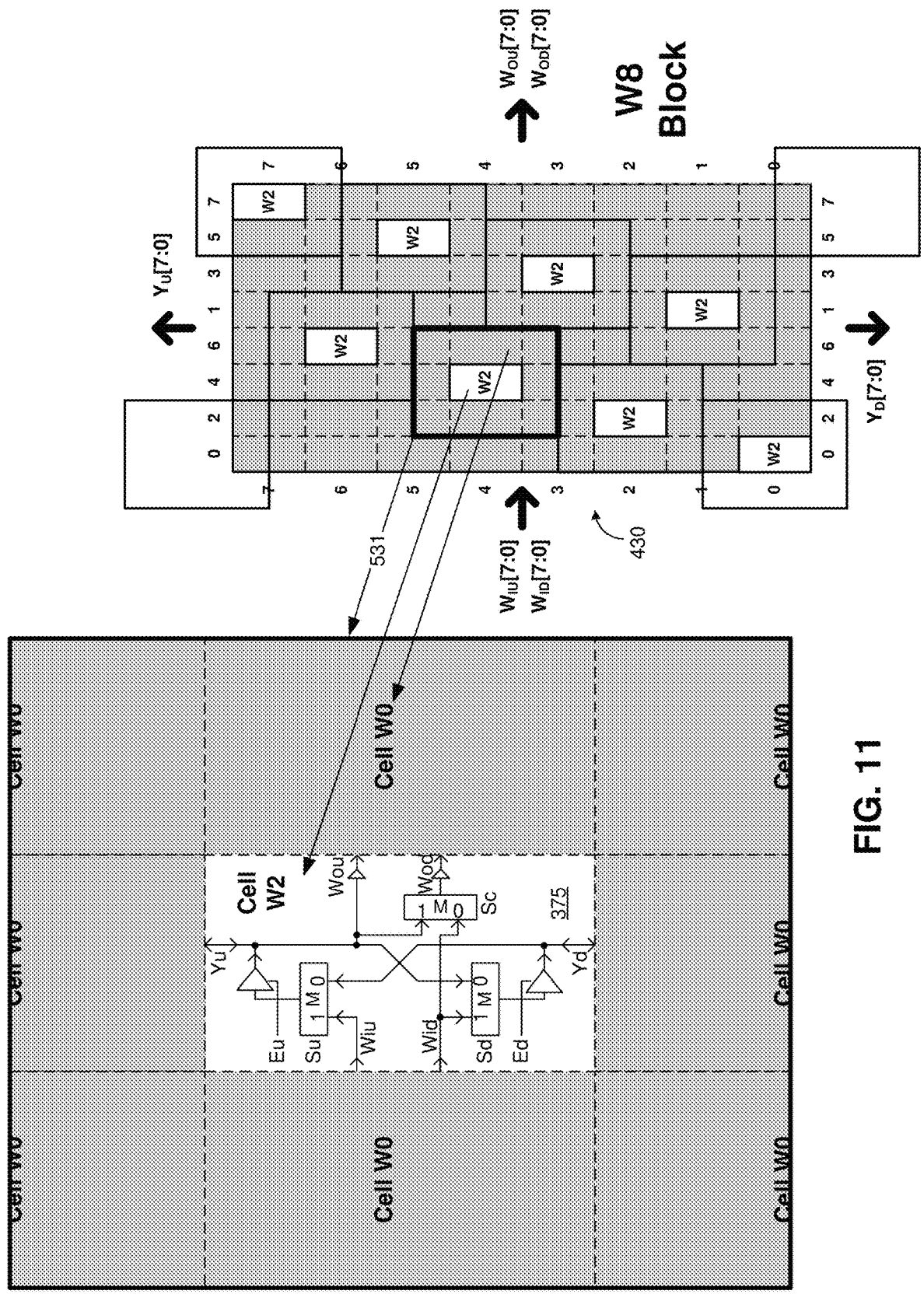
FIG. 11 illustrates an alternative layout of transfer cells (W2) within a W8 transfer block that increases the die area available for transfer cell implementation.

FIG. 11 illustrates an alternative layout of W2 cells within a W8 transfer block 430 that increases the die area available for W2 cell implementation. Viewing the eight W2 cells as a 2×4 cell array that is to be distributed within the 8×8 W8 block, then each W2 cell may be disposed four array positions (i.e., the number of available cell positions along the X axis, 8, divided by the number of W2 cells to be disposed along that axis, 2) from its neighbor in an adjacent row and two array positions (Y axis dimension, 8, divided by W2 cells to be distributed (4)) from its neighbor in an adjacent column. The eight upper and lower transfer path segments, Yu and Yd, are remapped accordingly as shown by the signal group numbering along the upper and lower edges of the W8 block. By this arrangement, the die area available for implementation of the multiplexing elements, tri-state drivers and buffer amplifiers within each W2 cell 375 is substantially expanded, for example, to the outer border of the peripheral routing cells (W0) shown in detail view 431 and marked by bold lines within W8 block 430. Also, while a specific aspect ratio is shown for the W8 block and individual W2 and W0 cells therein, other aspect ratios may apply in alternative embodiments, including aspect ratios in which cell implementation area may be optimized by different layout patterns. Further, while shown in the context of a W8 block, the transfer cell layout of FIG. 11 may also be employed within the R8 block discussed below.

Figure 12:
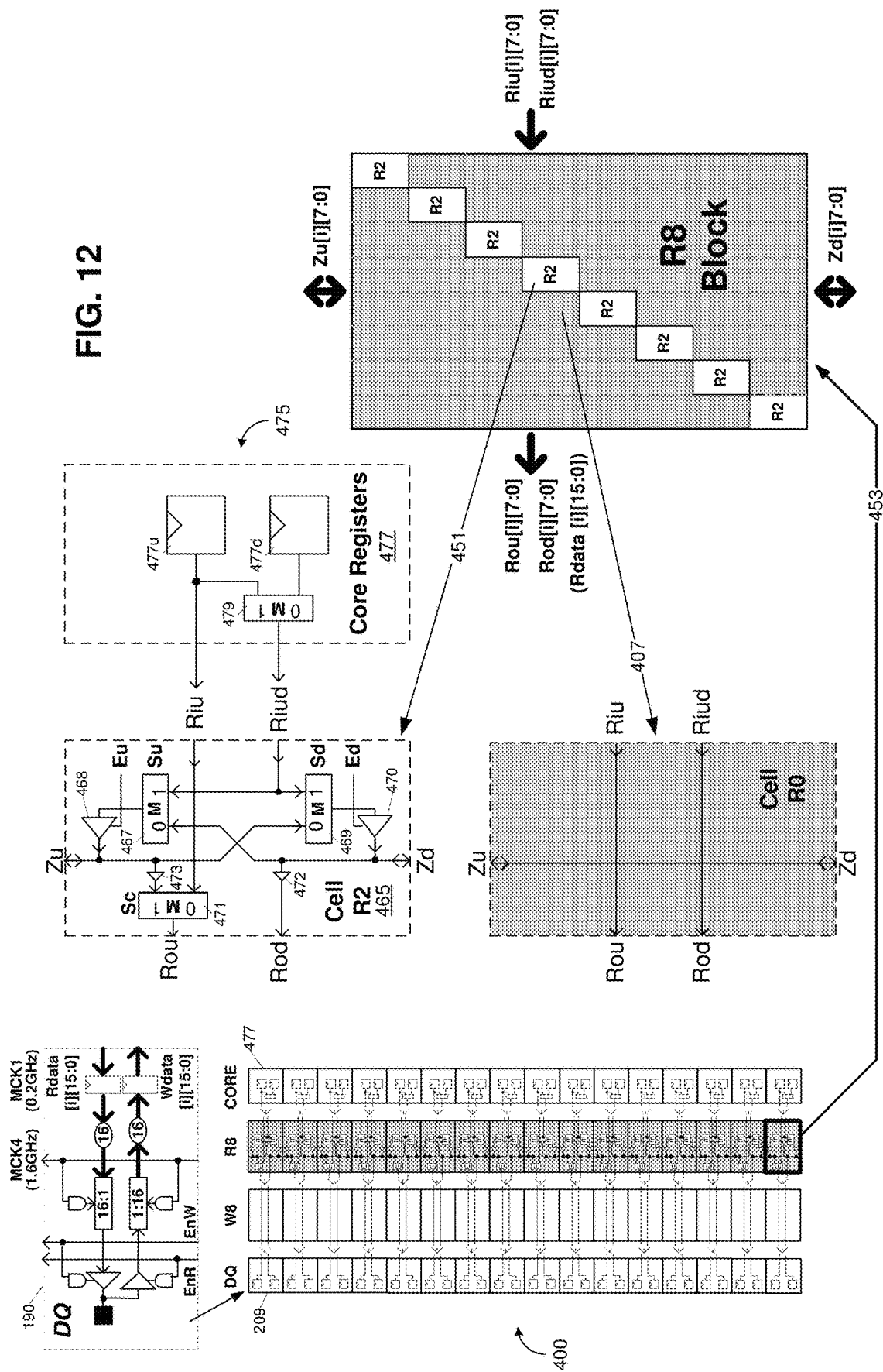
FIG. 12 illustrates an embodiment of a split-route, bidirectional transfer cell that may be used within the read data path of a ×16 IC signaling interface.

FIG. 12 illustrates an embodiment of a split-route, bidirectional transfer cell R2 465 that may be used within the read data path of ×16 IC signaling interface 400. That is, the R2 cells may be disposed, together with routing cells R0, within an R8 block as shown at 453 to effect the split-route, bidirectional transfer operation generally described in reference to FIGS. 6A, 6B and 7.

In contrast to the write-data transfer cells (e.g., described in reference to FIGS. 7 and 8) which effect a data fan-out within a single-source I/O cluster, the read-data transfer cells 465 perform a serialization or multiplexing function. Thus, while the select/enable signals used to establish the state of the write-data transfer cells may be maintained in a steady state for a given logical width configuration (e.g., fanning-out data to all core registers, with the core register load sequence being controlled by other logic within the core), the select/enable signals used to establish the state of the read-data transfer cells may be transitioned during sub-column-cycle intervals to establish a multiplexed path between different sets of core registers 477 and the read data registers 209 of an active I/O node. Further, within the split-routing embodiment shown, the upper-data and lower-data registers 477u, 477d that constitute a given core register 477 may be alternately selected as a read data source, as shown in detail view 475. In the embodiment of FIG. 12, this selection between upper and lower core register data sources is performed by multiplexer 479 (depicted as being part of a core register 477, though the multiplexer may alternatively be deemed a constituent of the R2 cell 465), which supplies input signal Rid/Rud ("Riud") to one input of the R2 cell. As shown, the R2 cell additionally receives input Riu directly from the upper register 477u of the core data register pair, and otherwise includes upper and lower segment multiplexers 467, 469 and upper and lower segment drivers 468, 470 (i.e., tri-state drivers) to control signals enabled onto upper and lower transfer segment paths, Zu and Zd, in generally the manner described in reference to transfer cell 375 of FIG. 7. An output multiplexer 471 is also provided to enable either the upper path segment, Zu (via buffer 473), or the upper core register 477$u$ to be the source of the signal driven onto upper data output, Rou. The lower data output, Rod, is driven via buffer 472 according to the signal present on lower path segment, Zd. By this arrangement, the following states may be achieved to support different interface width configurations, and different multiplexed paths within those width configurations:

Direct Output (Eu=1, Su=1, Ed=0, Sd=x, Sc=0): upper data from local core register delivered to upper data output (Rou) via output multiplexer (471), multiplexed data input (Riud) from local core register (i.e., signal output via core-register multiplexer 479) selected by lower segment multiplexer and driven onto lower transfer path segment for delivery to lower data output (Rod), and upper transfer path segment undriven;

Semi-Drive (Upper): (Eu=1, Su=1, Ed=0, Sd=x, Sc=1): multiplexed data input (Riud) driven onto upper transfer path segment for delivery to either local upper output (via output multiplexer) or lower output of upstream transfer cell, while lower transfer path segment undriven;

Semi-Drive (Lower): (Eu=0, Su=0, Ed=1, Sd=1, Sc=1): multiplexed data input (Riud) driven onto lower transfer path segment for delivery to upper output of downstream cell (i.e., via output multiplexer within that cell) while upper transfer path segment is undriven;

Transfer-Up (Eu=1, Su=0, Ed=x, Sd=x, Sc=x): signal present on lower path segment driven onto upper path segment, thus effecting an upward lateral transfer;

Transfer-Down (Ed=1, Sd=0, Eu=0, Su=x, Sc=x): signal present on upper path segment driven onto lower path segment, thus effecting a downward lateral transfer; and Isolation: upper and lower transfer path segments undriven, and upper path segment coupled in common to upper and lower data outputs (Eu=0, Ed=0, Su=x, Sd=x, Sc=1).

FIGS. 13A-13E illustrate exemplary interface widths enabled by the split-route, bilateral transfer blocks R8 of FIG. 12, and the state control signals (Eu, Su, Ed, Sd, Sc, as shown at 490) applied to each of the R2 transfer cells therein. For example, in the ×16 configuration shown in FIG. 13A, each R8 transfer cell block (numbered 0-15 from bottom up) is set to the direct output state to deliver the data from the upper local core register (element 477$u$ of FIG. 12) to the upper read-data register of the local I/O node via the output multiplexer 471 within each $R_2$ cell, and to deliver the data from the lower local core register (element 477$d$ of FIG. 12) to the lower read-data register of the local I/O node via the lower transfer path segment (i.e., via lower segment multiplexer 469 and lower segment driver 470). In this width configuration, no lateral transfer is effected between the R8 cells, and, because data need not be multiplexed to a single I/O node from multiple core registers, the transfer-state control signals may remain in the steady state shown.

In the ×8 configuration depicted in FIG. 13B, each R8 transfer block is operated in the upper semi-drive state to deliver core data (i.e., either upper or lower data from the corresponding core register, according, for example, to the state of a sub-column address bit) onto a respective one of the sixteen upper transfer path segments (Zu in FIG. 12). Because the upper transfer path segment for each R8 transfer block is coupled to the lower transfer path segment for the block above, core data from either the upper half or lower half of all sixteen core registers is delivered concurrently to the upper and lower data outputs for the eight active I/O nodes. As in the ×16 configuration, no path multiplexing occurs within the R8 transfer blocks, so the transfer-state control signals may remain at the steady states shown.

In the ×4 configuration (FIG. 13C), each R8 transfer block is operated in either an upper semi-drive state or lower semi-drive state to deliver core data to a selected (active) I/O node centered within a four-node cluster. Further, the segment multiplexers and/or segment drivers of R8 blocks that deliver data to the active I/O node via a shared segment of the lateral transfer path are alternated between states that enable data from different core register sources to be time-multiplexed to a given I/O node in respective half cycles via the shared transfer path segment. Referring to the cluster of four R8 blocks corresponding to I/O nodes 12-15, for example (i.e., R8 transfer blocks corresponding to the top four I/O nodes and referred to as R8 blocks 12-15), data from the core registers corresponding to R8 blocks 14 and 15 are time multiplexed onto the upper transfer path segment within R8 block 14 (i.e., a shared transfer path segment), and data from the core register corresponding to R8 blocks 12 and 13 are time multiplexed onto the upper transfer path segment within R8 block 13 (and also the lower segment path within R8 block 14). Accordingly, during the first half of a memory access cycle (e.g., a column read cycle), R8 blocks 15 and 13 are set to lower and upper semi-drive states, respectively, to deliver data to the upper and lower data outputs of active-node R8 block 14 (i.e., the R8 block corresponding to shaded I/O node, 14), while R8 blocks 12 and 14 are set to an isolation state. In the second half of the memory access cycle, by contrast, R8 transfer blocks 12 and 14 are set to semi-drive states (upper) to deliver data to the upper and lower data outputs of R8 block 14, while R8 transfer block 15 is set to an isolation state (thus avoiding contention with the data output from transfer block 14) and R8 block 13 is set to a transfer-up state (thus passing the data from R8 block 12 to the lower data output of R8 block 14. The remaining 4-block clusters of R8 blocks (0-3, 4-7, 8-11) are operated in the same manner as R8 blocks 12-15. Note that instead of being switched between semi-drive and isolation states, the bottom block in each 4-block cluster (i.e., R8 blocks 0, 4, 8 and 12) may be left statically in the semi-drive (upper) state throughout the memory access cycle as upper segment multiplexer in the immediately upstream R8 block (i.e., in R8 blocks 1, 5, 9 and 13) isolates the upper transfer segment of the bottom block during the first half of the memory access cycle.

In the ×2 configuration (FIG. 13D), each R8 transfer block is operated in either an upper semi-drive state or lower semi-drive state to deliver core data to a selected (active) I/O node centered within an eight-node cluster. As shown by the state control diagram presented beneath the ×2-configured interface, the segment multiplexers and/or segment drivers of R8 blocks that deliver data to the active I/O node via shared segments of the lateral transfer path are alternated between states that enable data from different core register sources to be time-multiplexed to a given I/O node in respective quarters (fourths) of a memory access cycles via the shared transfer path segment. Referring to the cluster of eight R8 blocks 8-15, for example, data from the core registers corresponding to R8 blocks 12-15 are time multiplexed onto the upper transfer path segment within R8 block 12, and data from core registers corresponding to R8 blocks 8-11 are time multiplexed onto the upper transfer path segment within R8 block 11 (and thus onto the lower segment path within R8 block 12). Accordingly, during the first quarter of a memory access cycle (e.g., a column read cycle), R8 blocks 15 and 11 are set to lower and upper semi-drive states, respectively, to deliver data to the upper and lower data outputs of active-node R8 block 12 (i.e., the R8 block corresponding to shaded I/O node). To support this transfer, R8 block 12 is isolated, R8 blocks 13 and 14 are set to transfer-down states, and R8 blocks 8, 9 and 10 are set to transfer-up states. During the second quarter of the memory access cycle, R8 blocks 14 and 10 are switched to lower and upper semi-drive states, respectively, while R8 block 11 is switched to a transfer-up state. During the third quarter of the memory access cycle, R8 blocks 13 and 9 are switched to lower and upper semi-drive states, respectively, while R8 block 10 is switched to a transfer-up state, and during the fourth and last quarter of the memory access cycle, R8 blocks 12 and 8 are switched to upper semi-drive states, respectively, while R8 block 9 is switched to a transfer-up state and R8 block 13 is isolated (thus preventing contention with the semi-drive state of R8 block 12). The remaining 8-block cluster, R8 blocks 0-7, may be operated in the same manner as R8 blocks 8-15. Further, although a particular set of state controls is shown, any R8 block that is decoupled from a shared transfer path segment by the state of an R8 block closer to the center of the cluster (i.e., closer to the active I/O node) may optionally be left in a semi-drive state, transfer state or isolation state. Also, while a particular time-multiplexing order has been shown (e.g., sourcing data from core registers corresponding to R8 blocks 15|11, 14|10, 13|9 and then 12|8), different time-multiplexing orders may be used in alternative embodiments.

In the ×1 configuration (FIG. 13E), the complete set of 16 R8 transfer blocks are operated in upper/lower semi-drive states to deliver core data to the I/O node corresponding to R8 block 8, the I/O node centered within the overall physical interface. As shown by the state control diagram presented below the ×1 configured interface, the segment multiplexers and/or segment drivers of R8 blocks that deliver data to the active I/O node via shared segments of the lateral transfer path are switched between states that enable data from different core register sources to be time-multiplexed to the active I/O node in respective eighths of a memory access cycle. Accordingly, during the first eighth of a memory access cycle (e.g., a column read cycle), R8 blocks 15 and 7 are set to lower and upper semi-drive states, respectively, to deliver data to the upper and lower data outputs of active-node R8 block 8. To support this transfer, R8 block 8 is set to the isolation state, R8 blocks 9-14 are set to transfer-down states, and R8 blocks 0-6 are set to transfer-up states (or, alternatively, set to isolation states as R8 blocks 0-6 are unused during the first portion of the memory access cycle). During the second eighth of the memory access cycle, R8 blocks 14 and 6 are switched to lower and upper semi-drive states, respectively, while R8 block 7 is switched to a transfer-up state. Similarly, during the third eighth of the memory access cycle, R8 blocks 13 and 5 are switched to lower and upper semi-drive states, respectively, while R8 block 6 is switched to a transfer-up state; during the fourth eighth of the memory access cycle, R8 blocks 12 and 4 are switched to lower and upper semi-drive states, respectively, while R8 block 5 is switched to a transfer-up state; during the fifth eighth of the memory access cycle, R8 blocks 11 and 3 are switched to lower and upper semi-drive states, respectively, while R8 block 4 is switched to a transfer-up state; during the sixth eighth of the memory access cycle, R8 blocks 10 and 2 are switched to lower and upper semi-drive states, respectively, while R8 block 3 is switched to a transfer-up state; during the seventh eighth of the memory access cycle, R8 blocks 9 and 1 are switched to lower and upper semi-drive states, respectively, while R8 block 2 is switched to a transfer-up state; and during the final eighth of the memory access cycle, R8 blocks 8 and 0 are switched to lower and upper semi-drive states, respectively, while R8 block 1 is switched to a transfer-up state, and R8 block 9 is switched to an isolation state (to avoid contention with the semi-drive state of R8 block 8). As discussed above, while a particular set of state controls is shown, any R8 block that is decoupled from a shared transfer path segment by the state of an adjacent R8 block closer to the center of the cluster may optionally be left in a semi-drive state, transfer state or isolation state. Also, data may be time-multiplexed from the various core registers in different order in alternative embodiments.

Figure 14:
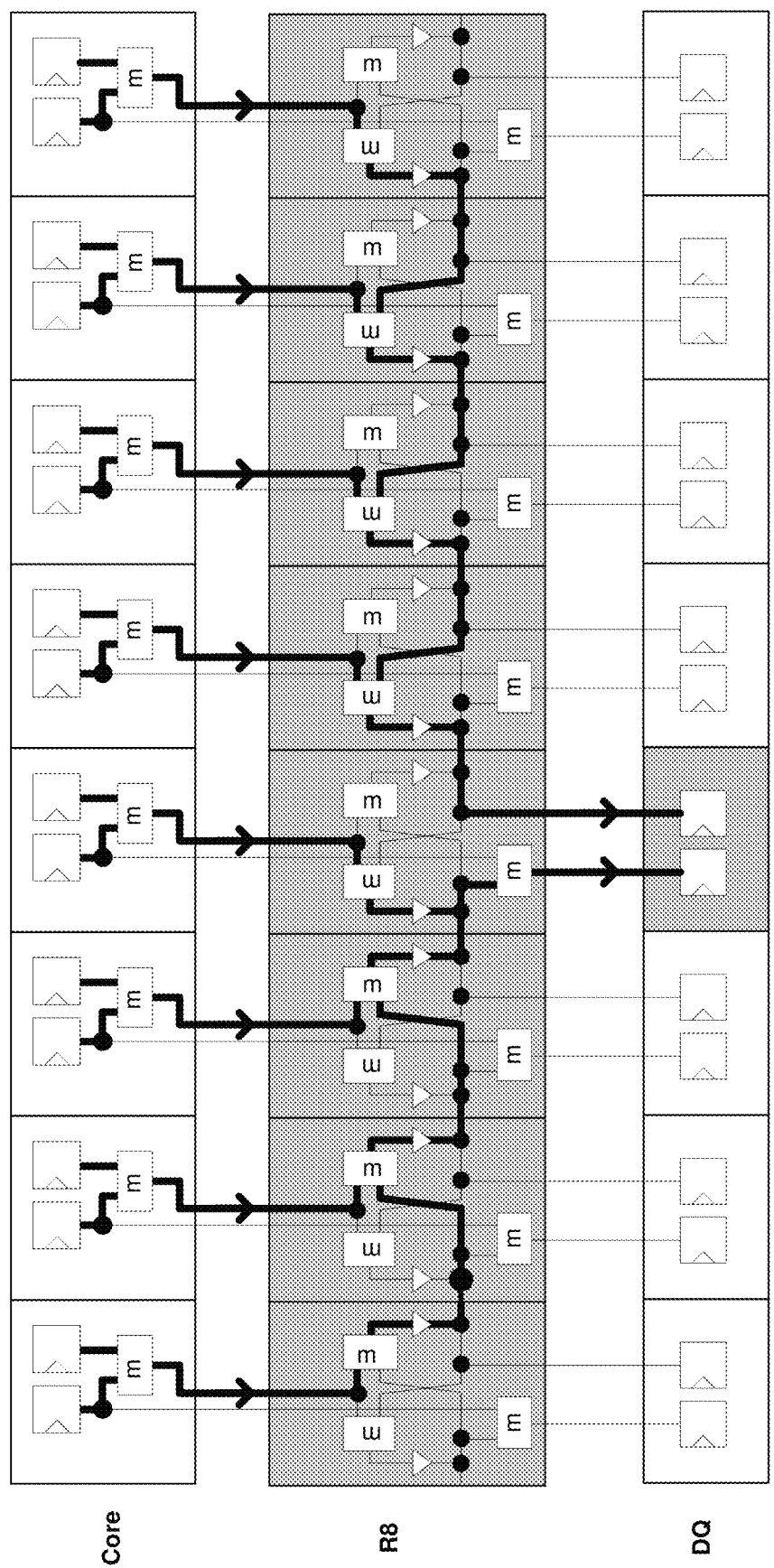
FIG. 14 illustrates an expanded view of an 8-I/O single-source cluster within the ×2 configuration shown in Figure.

FIG. 14 illustrates an expanded view of an 8-I/O single-source cluster within the ×2 configuration shown in FIG. 13D to provide an appreciation of the upward and downward transfer routing enabled by the split-route, bidirectional transfer cells within each R8 transfer block. Reflecting on FIGS. 10 and 14, which illustrate segmented lateral transfer structures dedicated to write-data and read-data transfer, respectively, it should be noted that constituent components within either of transfer structures (including the transfer path segments themselves) may be used to convey both write and read data, thus reducing the amount of circuitry and signal conduction paths required, and thus further improving the area efficiency of the adjustable-width signaling interface. More generally, such resource sharing may be employed in any counterpart read and write data transfer structures disclosed herein. Additionally, the various buffer amplifiers, tri-state drivers and any other power-consuming elements of the various segmented lateral transfer structures disclosed herein may be disabled for power-conservation purposes during idle periods, including brief periods interspersed between memory access operations in which the lateral transfer structures are used to convey data between the PHY, as well as various low-power modes that may be employed within the host integrated circuit component.

Figure 15A:
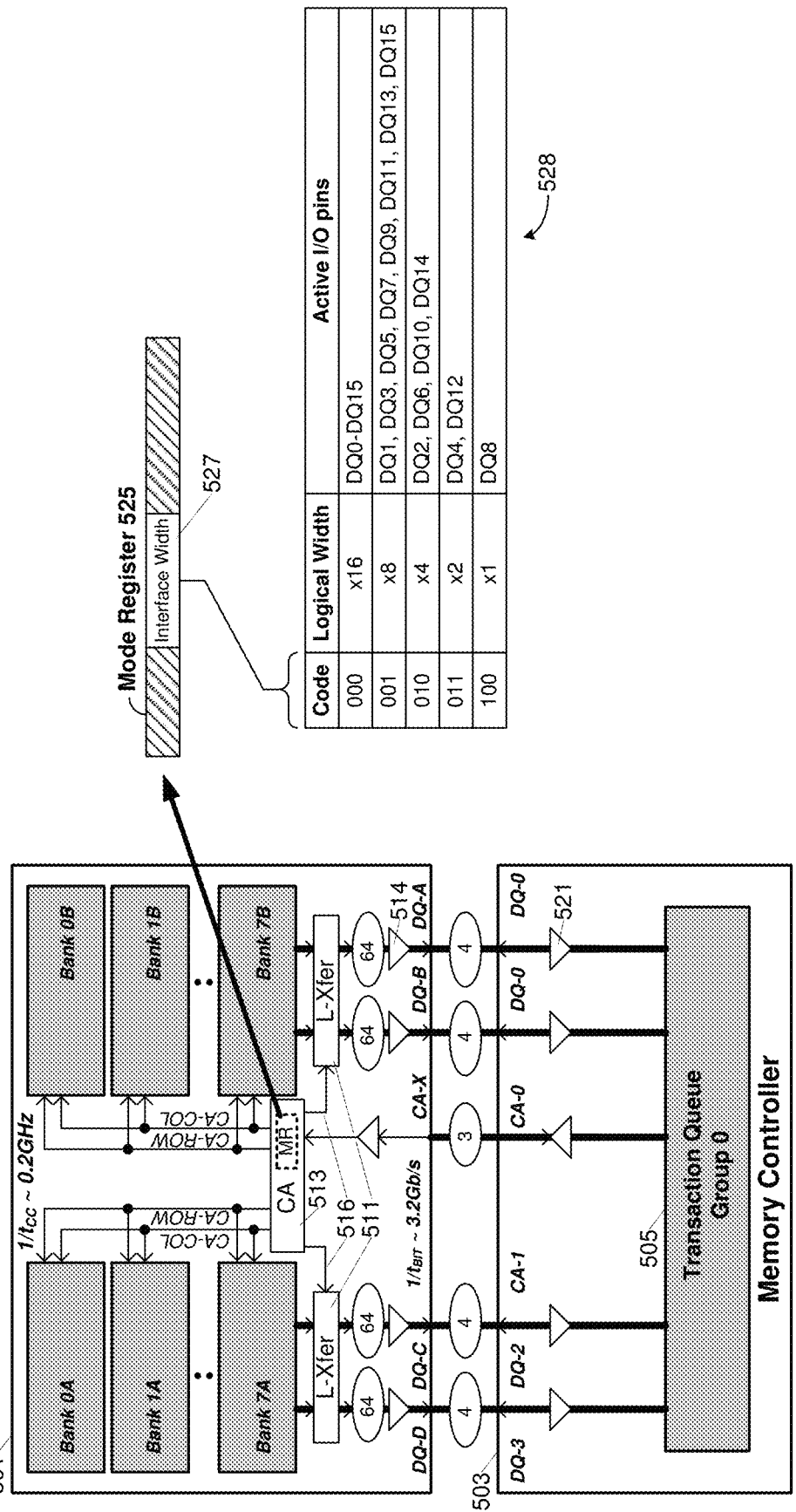
FIGS. 15A-15C illustrate embodiments of memory systems having adjustable-width memory components that may employ any of the segmented lateral transfer paths as described herein.
Figure 15C:
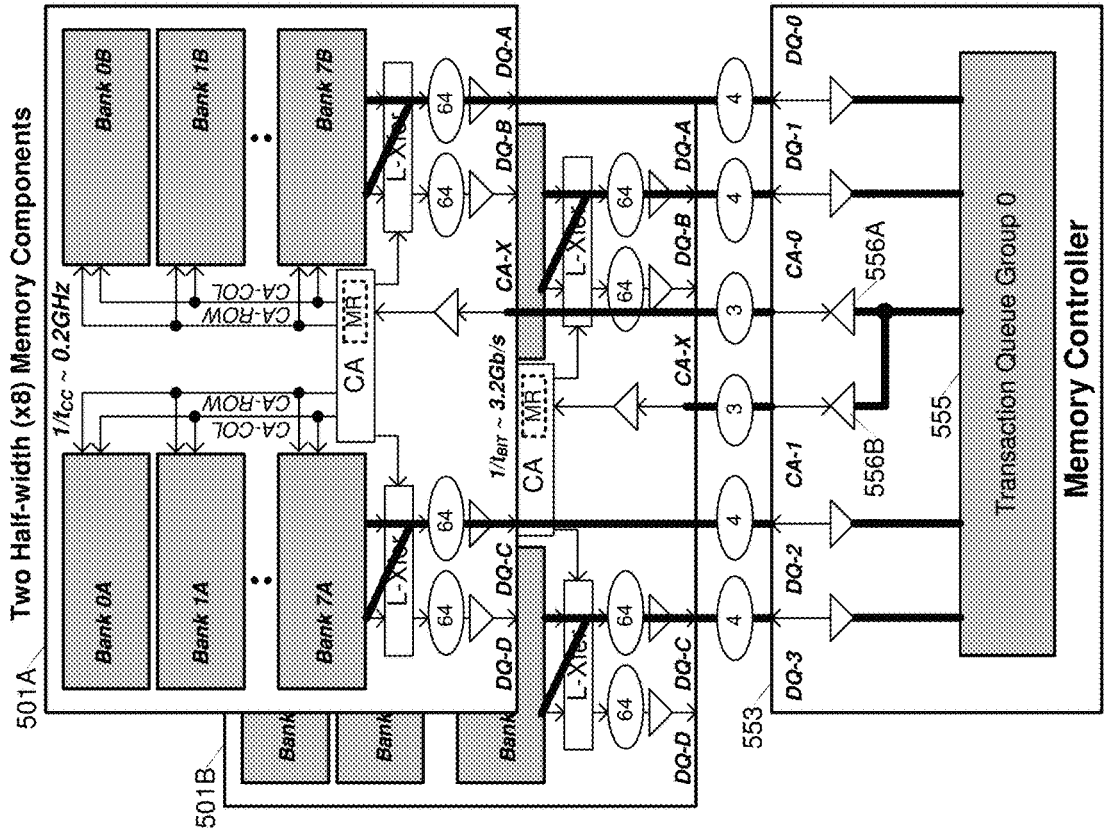
Figure 15B:
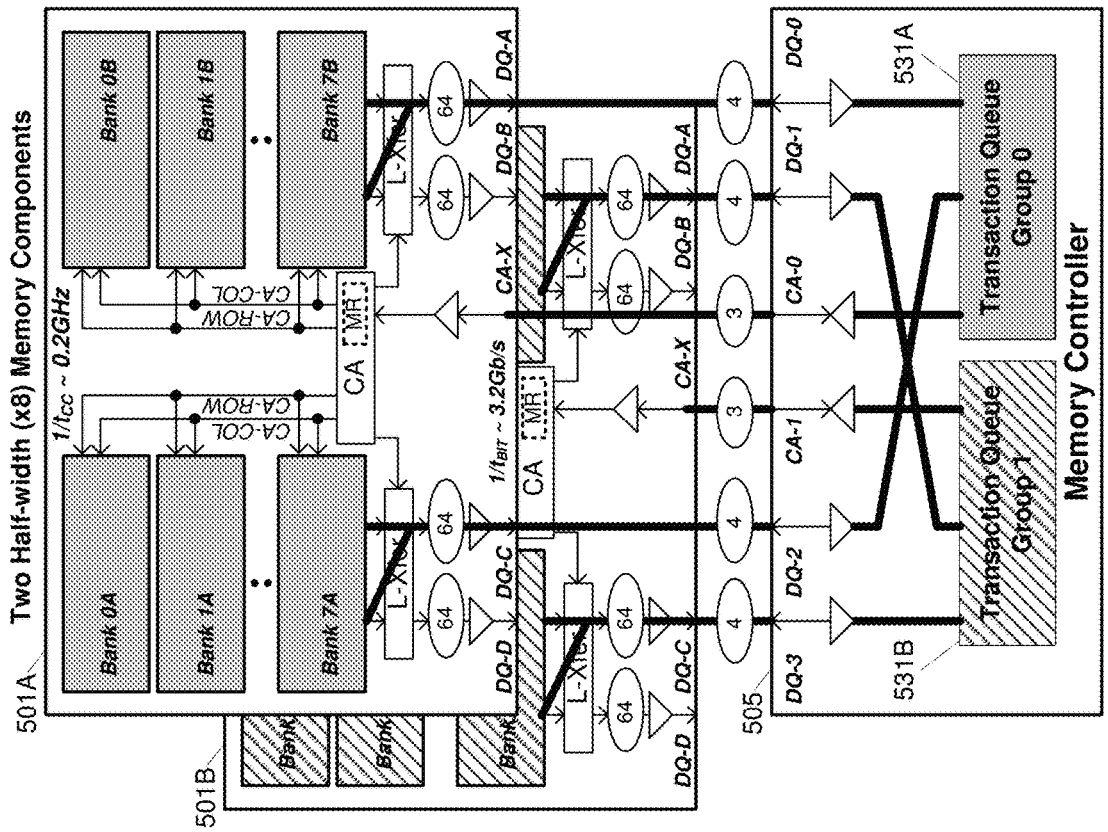

FIGS. 15A-15C illustrate embodiments of memory systems having adjustable-width memory components that may employ any of the segmented lateral transfer paths as described herein. Each of the memory systems includes a memory controller component configured to manage memory access transactions with one or more memory components. In the embodiment of FIG. 15A, for example, a single transaction queue 505 within memory controller 503 manages memory access transactions (e.g., issuance of memory access commands and corresponding read/write data transfer) with respect to a memory component 501 configured to have a native (or full-width) data interface. In the example shown, the full-width memory-side data interface is a ×16 interface coupled to 16 data links (i.e., four link interface groups DQ-A, DQ-B, DQ-C and DQ-D each coupled to a respective set of four data links) in which data is transmitted at a 3.2 Gb/s (e.g., in response to rising and falling edges of a 1.6 GHz clock, or rising edges of two complementary 1.6 GHz clocks), thereby establishing a total data interface bandwidth of 6.4 GB/s (6.4 gigabytes per second). A three-bit-wide memory-side CA interface (CA-X) is used to receive and forward memory commands (e.g., row activation commands and column read/column write commands in a DRAM component) and address values to command/address control logic 513, which in turn issues row and column access control and address signals (CA-Row, CA-Col) to an address-selected storage bank within the memory core (e.g., banks 0A/B-7A/B). As shown, the memory core, which may be deemed to include control logic 513, operates at a 200 MHz (0.2 GHz) column cycle rate (i.e., column read/write operations are carried out on 5 nS intervals) which establishes the core clock frequency and thus a 16:1 read data serialization ratio (or 1:16 write data deserialization ratio) within the link transceivers 514. Accordingly, 16 bits of data per signaling link are provided to or from the memory core in a given column read or write operation, thus establishing a 256-bit (32 byte) column access granularity. Data to be retrieved as part of a column read operation is output from the address-selected bank (and storage row and column) to lateral transfer structures 511 and, in the native-width configuration shown, delivered directly data transceivers 514 for transmission to memory controller 503 via the sixteen data links. That is, the lateral transfer structure is configured as shown, for example, in FIGS. 9A and 13A, to implement the ×16 data interface. Transceivers 521 within memory controller 503 receive the incoming read data and deliver the data to temporary storage buffers within (or associated with) transaction queue 505 for eventual output to a memory requester (which may be included within the same IC as the memory controller or may be different IC). Write data is conveyed from memory controller 503 to memory component 501 follows essentially the reverse path of the read data, from controller-side transceivers 521 to memory-side transceivers 514, through the lateral transfer structure 511 for storage within an address selected storage bank, row and column.

In one embodiment, the command/address logic 513 within memory component 501 includes a programmable mode register 525 having an interface width field 527. The memory controller programs the mode register, for example, by issuing a register-write command and corresponding register value via the command/address path (although the register value may alternatively be issued via one or more data links). Memory component 501 responds to the register-write command by loading the register value into the mode register (which may include multiple registers), including loading an interface width setting into interface width field 527. The interface width setting is supplied to interface control circuitry within command/address logic 513 which responsively outputs static and/or dynamic transfer-state control signals 516 corresponding to the specified interface width (e.g., as described in reference to FIGS. 9A-9E and 13A-13E) to lateral transfer circuitry 511.

In the embodiment shown, the interface width setting is a three-bit code having one of five values to establish the different logical widths shown (i.e., ×16, ×8, ×4, ×2, ×1, though more or fewer width configurations may apply in alternative embodiments). In the memory component shown, the lateral transfer structure 511 implements a split-route, bilateral transfer operation and thus effects a centered I/O arrangement as discussed above. That is, as shown in the table at 528, the active I/O pins (or other interconnects) for each logical width narrower than the native width of the memory component (i.e., ×8 and below in the example shown) are mutually exclusive. For example, none of the active I/O pins in any logical width configuration of ×8 or narrower is used in any other logical width configuration of ×8 or narrower. Thus, each register programming operation that sets a logical width narrower than the native width of the memory device enables data transfer via an exclusive subset of the I/O pins of memory component 501 (i.e., pins that are unused in any other logical width narrower than the native width of the memory device).

In the embodiment of FIG. 15B two memory components 501A and 501B are configured to have ×8 logical interface widths (e.g., by establishing the lateral transfer paths shown in FIGS. 9B and 13B, with I/O nodes 1, 3, 5 and 7 corresponding to DQ-A and I/O nodes 9, 11, 13 and 15 corresponding to DQ-C). Even-numbered controller-side data interface nodes DQ-0 and DQ-2 are coupled via respective data signaling links to I/O nodes DQ-A and DQ-C within memory component 501A, and odd-numbered controller-side data I/O nodes DQ-1 and DQ-3 are coupled to I/O nodes DQ-A and DQ-C within memory component 501B. Separate transaction queues 531A, 531B are maintained for the two different memory components, with transaction queue 531A supplying command/address values to memory component 501A via a first set of CA links (i.e., driven by controller-side CA interface, CA-0), and transaction queue 531B supplying C/A values to memory component 501B via a second set of CA links (driven by controller-side CA interface, CA-1). The even-numbered and odd-numbered controller-side data I/O nodes are coupled to receive write data from and deliver read data to storage buffers within (or associated with) transaction queues 531A and 531B, respectively. By this arrangement, the 6.4 GB/s bandwidth of the memory system is maintained, but split between two separately addressed memory components 501A, 501B, thereby establishing a 16B column access granularity within each memory component.

FIG. 15C illustrates an alternative memory system embodiment involving the same memory components shown in FIG. 15B, but configured for shared-command operation. That is, each of memory components 501A, 501B is configured to have a ×8 interface width (e.g., by establishing the lateral transfer paths shown in FIGS. 9B and 13B, with I/O nodes 1, 3, 5 and 7 corresponding to DQ-A and I/O nodes 9, 11, 13 and 15 corresponding to DQ-C), but a single transaction queue 555 within memory controller 553 is used to source commands to the memory components (thereby operating the two components in lock step) and to send/receive data to/from each. Though respective command/address drivers 556A, 556B are provided to output command/address values to the two memory components, this is not necessary in all cases. Rather, a single command/address output from memory controller 553 may be routed to both memory components 501A, 501B (i.e., command inputs of the memory components are coupled in common) so that, from the perspective of memory controller 553, the two memory components appear to be a single component having a doubled storage capacity of either memory component 501A, 501B alone.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within a memory control integrated circuit (IC), the method comprising:

transmitting, to a memory IC having a programmable register, data signal receivers and a data storage array, a command to store a logical-width value within the programmable register; and transmitting write data to the memory IC via (i) a first quantity of signaling links, the write data to be sampled exclusively within a first subset of the data signal receivers if the logical-width value specifies a first data-interface width, and (ii) a second quantity of signaling links, fewer than the first quantity, the write data to be sampled exclusively within a second subset of the data signal receivers if the logical-width value specifies a second data-interface width, the second subset of the data signal receivers including (a) fewer of the data signal receivers than the first subset and (b) at least one of the data signal receivers not included in the first subset.

2. The method of claim 1 further comprising transmitting, to the memory IC, a command to store the write data within the data storage array.

3. The method of claim 1 wherein transmitting the command to store the logical-width value within the programmable register of the memory IC comprises transmitting an instruction to store a logical-width value that specifies (i) one of the first or second data-interface widths or (ii) a third data-interface width wider than the first data-interface width.

4. The method of claim 3 wherein transmitting the write data to the memory IC comprises transmitting the write data to the memory IC via a third quantity of signaling links, greater than the first quantity, to be sampled within the memory IC via all the data signal receivers if the logical-width value specifies the third data-interface width.

5. The method of claim 1 wherein transmitting the command to store the logical-width value within the programmable register of the memory IC comprises transmitting an instruction to store a logical-width value that specifies (i) one of the first or second data-interface widths, (ii) a third data-interface width wider than the first data-interface width, or (iii) a fourth data-interface width narrower than the second data-interface width.

6. The method of claim 5 wherein transmitting the write data to the memory IC comprises transmitting the write data to the memory IC via a single signaling link to be sampled within the memory IC exclusively via a single one of the data signal receivers if the logical-width value specifies the fourth data-interface width.

7. The method of claim 1 wherein the first subset of the data signal receivers comprises at least one of the data signal receivers not included in the second subset.

8. The method of claim 1 wherein none of the data signal receivers included in the second subset are included in the first subset.

9. The method of claim 1 wherein the second subset of the data signal receivers comprises not more than half as many of the data signal receivers as the first subset.

10. The method of claim 1 further comprising transmitting a data timing signal to the memory IC, wherein:

the write data is to be sampled exclusively within the first subset of the data signal receivers at times indicated by transitions of the data timing signal if the logical-width value specifies the first data-interface width; and the write data is to be sampled exclusively within the second subset of the data signal receivers at times indicated by transitions of the data timing signal if the logical-width value specifies a second data-interface width.

11. The method of claim 1 wherein transmitting to the memory IC the command to store the logical-width value within the programmable register comprises transmitting, to a command/address interface of the memory IC, a register programming instruction and the logical-width value.

12. A memory control integrated circuit (IC) comprising:
a command/address interface to transmit, to a memory IC having a programmable register, data signal receivers and a data storage array, a command to store a logical-width value within the programmable register; and
a data interface to transmit write data to the memory IC via (i) a first quantity of signaling links, the write data to be sampled exclusively within a first subset of the data signal receivers if the logical-width value specifies a first data-interface width, and (ii) a second quantity of signaling links, fewer than the first quantity, the write data to be sampled exclusively within a second subset of the data signal receivers if the logical-width value specifies a second data-interface width, the second subset of the data signal receivers including (a) fewer of the data signal receivers than the first subset and (b) at least one of the data signal receivers not included in the first subset.

13. The memory control IC of claim 12 wherein the command/address interface to transmit the command to store the logical-width value comprises circuitry to transmit, to the memory IC, a command to store the write data within the data storage array.

14. The memory control IC of claim 12 wherein the command/address interface to transmit the command to store the logical-width value within the programmable register of the memory IC comprises circuitry to transmit an instruction to store a logical-width value that specifies (i) one of the first or second data-interface widths or (ii) a third data-interface width wider than the first data-interface width.

15. The memory control IC of claim 14 wherein the data interface to transmit the write data to the memory IC comprises circuitry to transmit the write data to the memory IC via a third quantity of signaling links, greater than the first quantity, to be sampled within the memory IC via all the data signal receivers if the logical-width value specifies the third data-interface width.

16. The memory control IC of claim 12 wherein the command/address interface to transmit the command to store the logical-width value within the programmable register of the memory IC comprises circuitry to transmit an instruction to store a logical-width value that specifies (i) one of the first or second data-interface widths, (ii) a third data-interface width wider than the first data-interface width, or (iii) a fourth data-interface width narrower than the second data-interface width.

17. The memory control IC of claim 16 wherein the data interface to transmit the write data to the memory IC comprises circuitry to transmit the write data to the memory IC via a single signaling link to be sampled within the memory IC exclusively via a single one of the data signal receivers if the logical-width value specifies the fourth data-interface width.

18. The memory control IC of claim 12 wherein the first subset of the data signal receivers comprises at least one of the data signal receivers not included in the second subset.

19. The memory control IC of claim 12 wherein none of the data signal receivers included in the second subset are included in the first subset.

20. The memory control IC of claim 12 further comprising a timing signal transmitter to transmit a data timing signal to the memory IC, wherein:
the write data is to be sampled exclusively within the first subset of the data signal receivers at times indicated by transitions of the data timing signal if the logical-width value specifies the first data-interface width; and
the write data is to be sampled exclusively within the second subset of the data signal receivers at times indicated by transitions of the data timing signal if the logical-width value specifies a second data-interface width.

21. An integrated-circuit memory control component comprising:
means for transmitting, to a memory IC having a programmable register, data signal receivers and a data storage array, a command to store a logical-width value within the programmable register; and
means for transmitting write data to the memory IC via (i) a first quantity of signaling links, the write data to be sampled exclusively within a first subset of the data signal receivers if the logical-width value specifies a first data-interface width, and (ii) a second quantity of signaling links, fewer than the first quantity, the write data to be sampled exclusively within a second subset of the data signal receivers if the logical-width value specifies a second data-interface width, the second subset of the data signal receivers including (a) fewer of the data signal receivers than the first subset and (b) at least one of the data signal receivers not included in the first subset.

* * * * *